United States Patent
Zang et al.

(10) Patent No.: US 11,450,678 B2
(45) Date of Patent: Sep. 20, 2022

(54) SPLIT GATE (SG) MEMORY DEVICE AND NOVEL METHODS OF MAKING THE SG-MEMORY DEVICE

(71) Applicant: GLOBALFOUNDRIES U.S. Inc., Santa Clara, CA (US)

(72) Inventors: Hui Zang, Guilderland, NY (US); Ruilong Xie, Niskayuna, NY (US); Shesh Mani Pandey, Saratoga Springs, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 50 days.

(21) Appl. No.: 16/683,439

(22) Filed: Nov. 14, 2019

(65) Prior Publication Data
US 2021/0151451 A1 May 20, 2021

(51) Int. Cl.
*H01L 29/423* (2006.01)
*H01L 27/11556* (2017.01)
*H01L 27/11582* (2017.01)
*H01L 29/51* (2006.01)

(52) U.S. Cl.
CPC .. *H01L 27/11556* (2013.01); *H01L 27/11582* (2013.01); *H01L 29/42328* (2013.01); *H01L 29/42352* (2013.01); *H01L 29/42364* (2013.01); *H01L 29/51* (2013.01)

(58) Field of Classification Search
CPC ......... H01L 27/11582; H01L 27/11556; H01L 29/42328; H01L 29/51; H01L 29/42352
See application file for complete search history.

(56) References Cited

U.S. PATENT DOCUMENTS

| | | | |
|---|---|---|---|
| 6,862,220 B2 | 3/2005 | Kawahara et al. | |
| 9,583,641 B1* | 2/2017 | Chang | H01L 29/66833 |
| 2009/0050955 A1 | 2/2009 | Akita et al. | |
| 2012/0299084 A1* | 11/2012 | Saito | H01L 29/40117 |
| | | | 257/324 |
| 2013/0171786 A1 | 7/2013 | Shroff et al. | |

(Continued)

OTHER PUBLICATIONS

Pitcher, "Thanks for the memory," www.newelectronics.co.uk, Apr. 26, 2016, pp. 24-25.

*Primary Examiner* — Sarah K Salerno
(74) *Attorney, Agent, or Firm* — Yee Tze Lim; Hoffman Warnick LLC

(57) ABSTRACT

One illustrative integrated circuit (IC) product disclosed herein includes a selection gate electrode and a first gate insulation layer positioned above a substrate and a memory gate electrode positioned above the substrate and adjacent the selection gate electrode, wherein the memory gate electrode comprises a bottom surface and first and second opposing sidewall surfaces. This embodiment of the IC product also includes a plurality of layers of insulating material, wherein a first portion of the layers of insulating material is positioned between the first gate insulation layer and the first opposing sidewall of the memory gate electrode, a second portion of the layers of insulating material is positioned between the bottom surface of the memory gate electrode and the upper surface of the semiconductor substrate, and a third portion of the layers of insulating material is positioned on the second opposing sidewall of the conductive memory gate electrode.

20 Claims, 27 Drawing Sheets

(56) References Cited

U.S. PATENT DOCUMENTS

2014/0091382 A1* 4/2014 Tadayoni .......... H01L 27/11524
  257/320
2014/0120713 A1  5/2014 Shroff et al.
2015/0041875 A1  2/2015 Perera
2015/0145023 A1* 5/2015 Arigane ............ H01L 27/11568
  257/326

* cited by examiner

SPLIT GATE (SG) MEMORY DEVICE AND NOVEL METHODS OF MAKING THE SG-MEMORY DEVICE

BACKGROUND

Field of the Invention

The present disclosure generally relates to various novel embodiments of a split gate memory device (SG-memory device) such as, for example, a split gate MONOS (Metal Oxide Nitride Oxide Semiconductor) device and various novel methods of making such an SG-memory device.

Description of the Related Art

In modern integrated circuit products, it is becoming more common to embed nonvolatile memory cells and logic-based semiconductor devices, such as microprocessors, together on the same semiconductor substrate (or chip) to increase the overall performance of the IC product. One form of nonvolatile memory cell is known as flash memory cells. One traditional form of such flash memory cell included a separate control gate and a separate floating gate that was positioned vertically below the control gate. A tunnel oxide is positioned between the floating gate and the substrate while another layer of oxide is positioned between the control gate and the floating gate. As a result, the stack of materials for the flash memory cell is much taller than the gate stack (gate electrode plus gate insulation layer) used on the transistors in the logic circuits. This difference in height makes embedding such flash memory devices on a substrate with logic devices challenging. Other forms of nonvolatile memory devices such as, for example, a split gate MONOS (Metal Oxide Nitride Oxide Semiconductor) device seek to overcome this problem by essentially forming two gate electrode structures—a selection gate electrode (CG) and a memory gate electrode (MG) above the substrate. A gate insulation layer was positioned between the selection gate electrode (CG) and the substrate. A combination of insulating materials, i.e., a tunnel oxide layer, a charge storage layer (e.g., silicon nitride) and an insulating oxide layer was also formed for the device. A first portion of these insulating materials was positioned between the selection gate electrode (CG) and memory gate electrode (MG). A second portion of these insulating materials was positioned vertically below the memory gate electrode (MG) and above the upper surface of the substrate. However, what is still needed is a way to manufacture such split-gate devices in a manner that is both efficient and can be readily incorporated into existing process flows that are used to manufacture high performance transistor devices.

The present disclosure is generally directed to various to various novel embodiments of an SG-memory device and various novel methods of making such an SG-memory device.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various to various novel embodiments of an SG-memory device and various novel methods of making such an SG-memory device. One illustrative integrated circuit (IC) product disclosed herein includes a conductive selection gate electrode and a first gate insulation layer positioned above a semiconductor substrate and a conductive memory gate electrode positioned above the semiconductor substrate and adjacent the conductive selection gate electrode, wherein the conductive memory gate electrode comprises a bottom surface and first and second opposing sidewall surfaces. This embodiment of the IC product also includes a plurality of layers of insulating material, wherein a first portion of the plurality of layers of insulating material is positioned between the first gate insulation layer and the first opposing sidewall of the conductive memory gate electrode, a second portion of the plurality of layers of insulating material is positioned between the bottom surface of the conductive memory gate electrode and the upper surface of the semiconductor substrate, and a third portion of the plurality of layers of insulating material is positioned on the second opposing sidewall of the conductive memory gate electrode.

Another illustrative IC product disclosed herein includes a conductive selection gate electrode and a first gate insulation layer positioned above a semiconductor substrate and a conductive memory gate electrode positioned above the semiconductor substrate and adjacent the conductive selection gate electrode, wherein the conductive memory gate electrode comprises a bottom surface and first and second opposing sidewall surfaces. This embodiment of the IC product also includes a first layer of insulating material positioned on and in contact with the first gate insulation layer and on an in contact with an upper surface of the semiconductor substrate, a second layer of insulating material positioned on and in contact with the first layer of insulating material, and a third layer of insulating material, wherein an outer surface of the third layer of insulating material is positioned on and in contact with the second layer of insulating material and an inner surface of the third layer of insulating material is positioned on and in contact with the first opposing sidewall surface, the bottom surface and the second opposing sidewall surface of the conductive memory gate electrode.

BRIEF DESCRIPTION OF THE DRAWINGS

The disclosure may be understood by reference to the following description taken in conjunction with the accompanying drawings, in which like reference numerals identify like elements, and in which.

Figure 1:
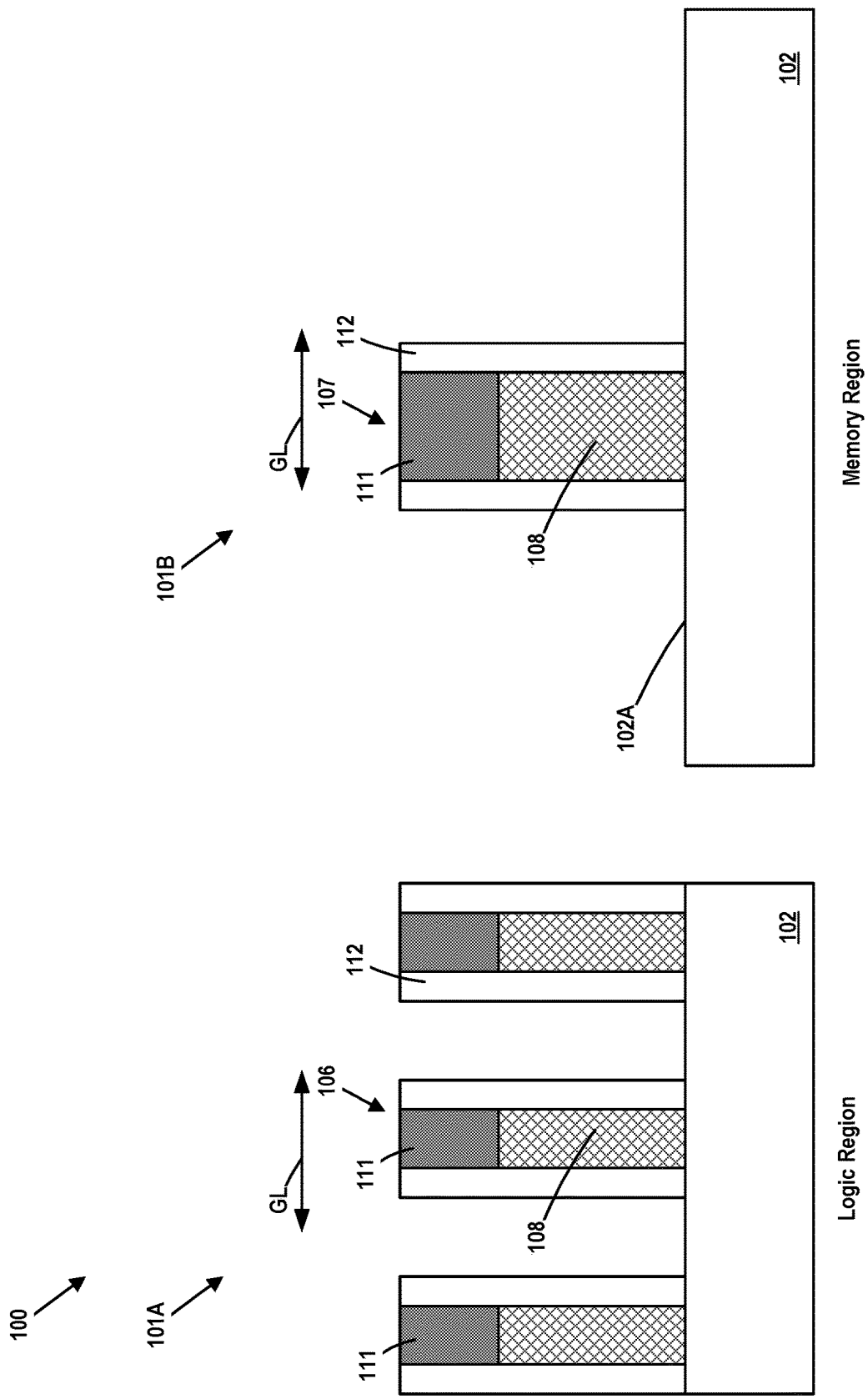
FIGS. 1-27 depict various novel embodiments of an SG-memory device and various novel methods of making such an SG-memory device. It should be noted that the attached drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-27 depicts an integrated circuit product 100 that comprises a logic region and a memory region. A plurality of transistor devices 101A will be formed in the logic region and a plurality of SG-memory devices 101B will be formed in the memory region, although only a single SG-memory device 101B will be shown in the memory region in the attached drawings. The IC product 100 will be formed above a semiconductor substrate 102. The substrate 102 may have a variety of configurations, such as a simple bulk configuration. Alternatively, the substrate 102 may be in the form of a semiconductor-on-insulator (SOI) substrate that includes a base semiconductor layer, a buried insulation layer positioned on the base semiconductor layer and an active semiconductor layer positioned above the buried insulation layer. The substrate 102 may be made of silicon or it may be made of materials other than silicon. Thus, the terms "substrate" or "semiconductor substrate" should be understood to cover all semiconducting materials and all forms of such materials. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application As will be appreciated by those skilled in the art after a complete reading of the present application, the transistor devices 101A and the SG-memory devices 101B disclosed herein may be N-type or P-type devices. Moreover, the transistor devices 101A and the SG-memory devices 101B disclosed herein may come in a variety of different forms, e.g., planar devices, FinFET devices, etc. In some cases, the transistor devices 101A may be FinFET devices and the SG-memory devices 101B may be planar devices, or vice-versa. In one particularly illustrative example, the transistor devices 101A and the SG-memory devices 101B are FinFET devices. However, as noted above, the various inventions disclosed herein should not be considered to be limited to the particular examples shown in the attached drawings and described below.

FIG. 1 depicts the IC product 100 after several steps have been taken to form the transistor devices 101A and the SG-memory devices 101B above the semiconductor substrate 102 having an upper surface 102A. In the illustrative case where the transistor devices 101A and the SG-memory devices 101B are FinFET devices, the upper surface 102A would correspond to the upper surface of a fin. FIG. 1 depicts the IC product 100 after a plurality of gates 106 were formed in the logic region for the transistor devices 101A (three of which are depicted) and a gate 107 was formed in the memory region for the single SG-memory device 101B depicted herein. Each of the gates 106, 107 comprises a sacrificial gate structure 108, a gate hardmask 111 and a sidewall spacer 112. The gate structures 108 generally comprise a sacrificial gate insulation layer (not separately shown) and a sacrificial gate electrode structure (not separately shown). In one embodiment, the sacrificial gate insulation layer may be a thermally grown layer of silicon dioxide, the sacrificial gate electrode structure may be made of a material such as polysilicon or amorphous silicon, while the gate hardmask 111 may be made of a material such as silicon nitride. The thickness of these materials may vary depending upon the particular application. The sidewall spacer 112 was formed by depositing a layer of spacer material (e.g., silicon nitride, a low-k material, etc.) and thereafter performing an anisotropic etching process. The spacer 112 may be of any desired thickness (as measured at its base). Of course, in some embodiments, more than one spacer may be formed adjacent the sacrificial gate structures 108.

The gate length direction (GL) for the transistor devices 101A and the SG-memory device 101B are depicted in FIG. 1 as well. As will be appreciated by those skilled in the art after a complete reading of the present application, the gate pitch for the gates 106 (for the transistor devices 101A) in the logic region may be much smaller than the gate pitch for the gates 107 (for the SG-memory devices 101B) in the memory region. Moreover, the gate structures 108 for the transistor devices 101A may have a much smaller critical dimension (in the gate length direction) than do the gate structures 108 for the SG-memory devices 101B.

Figure 2:
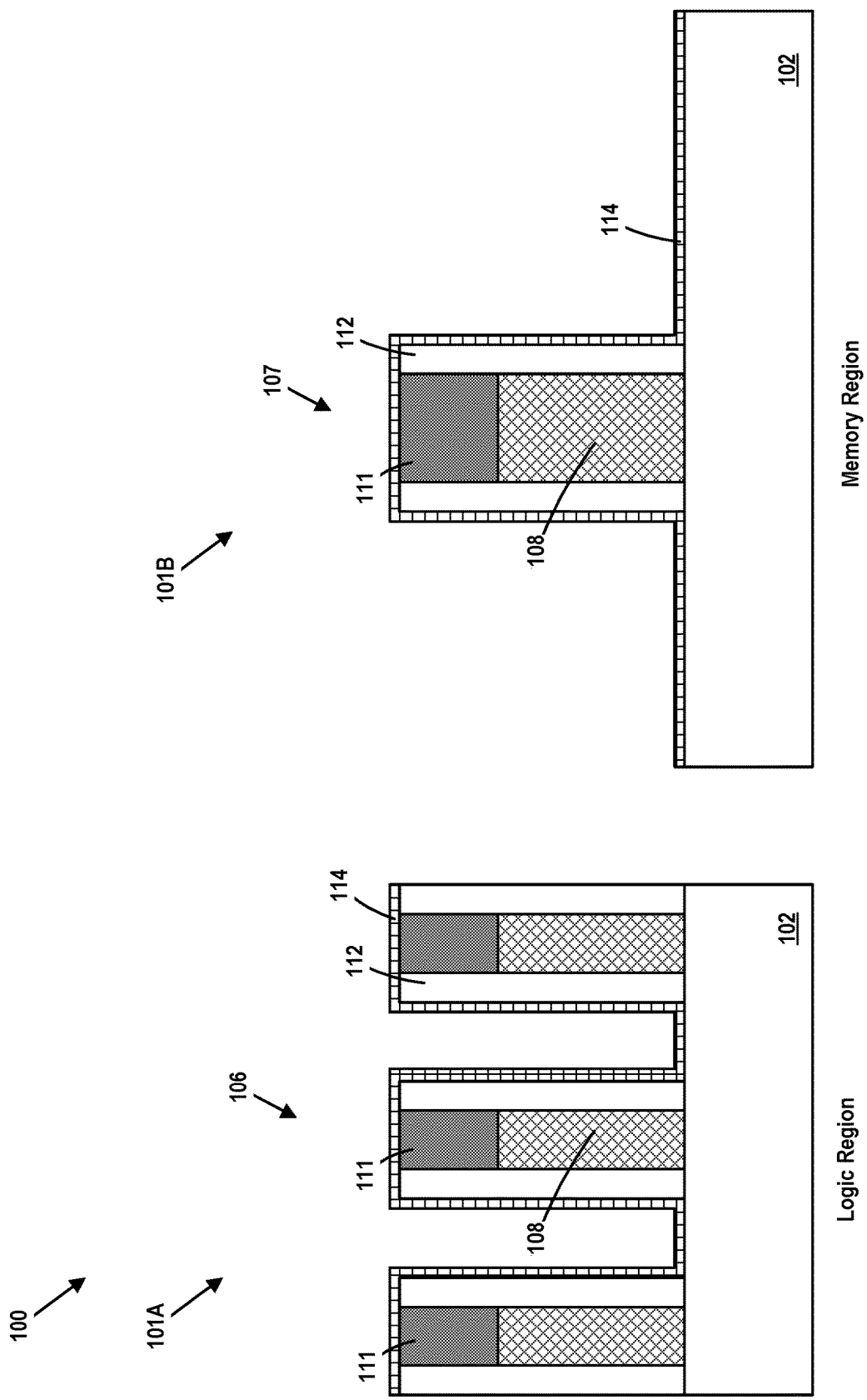

FIG. 2 depicts the IC product 100 after a conformal deposition process was performed to form a conformal etch-stop layer 114 above the substrate 102. The etch-stop layer 114 may be comprised of a variety of different materials, e.g., silicon nitride, and it may be formed to any desired thickness, e.g., 2-6 nm.

Figure 3:
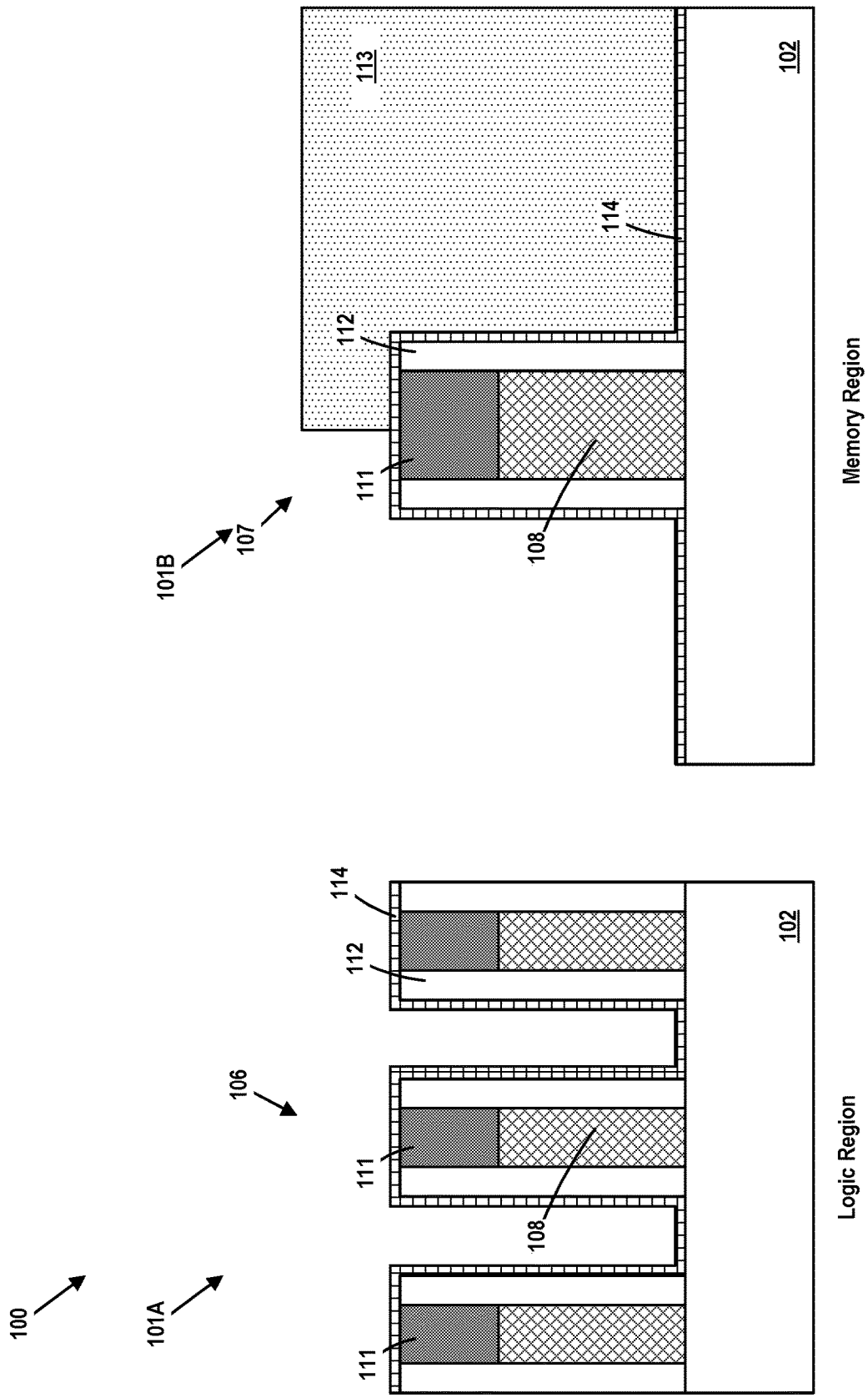

FIG. 3 depicts the IC product 100 after a patterned etch mask 113, e.g., a patterned layer of photoresist or OPL, was formed above the conformal etch-stop layer 114. Note that the patterned etch mask 113 covers one side of the SG-memory device 101B. As one example, where the transistor devices 101A and the SG-memory devices 101B shown in FIG. 2 are N-type devices, the patterned etch mask 113 would cover all of the P-type transistor devices (not shown) in the logic region, but the patterned etch mask 113 would not cover the N-type transistor devices 101A in the logic region.

Figure 4:
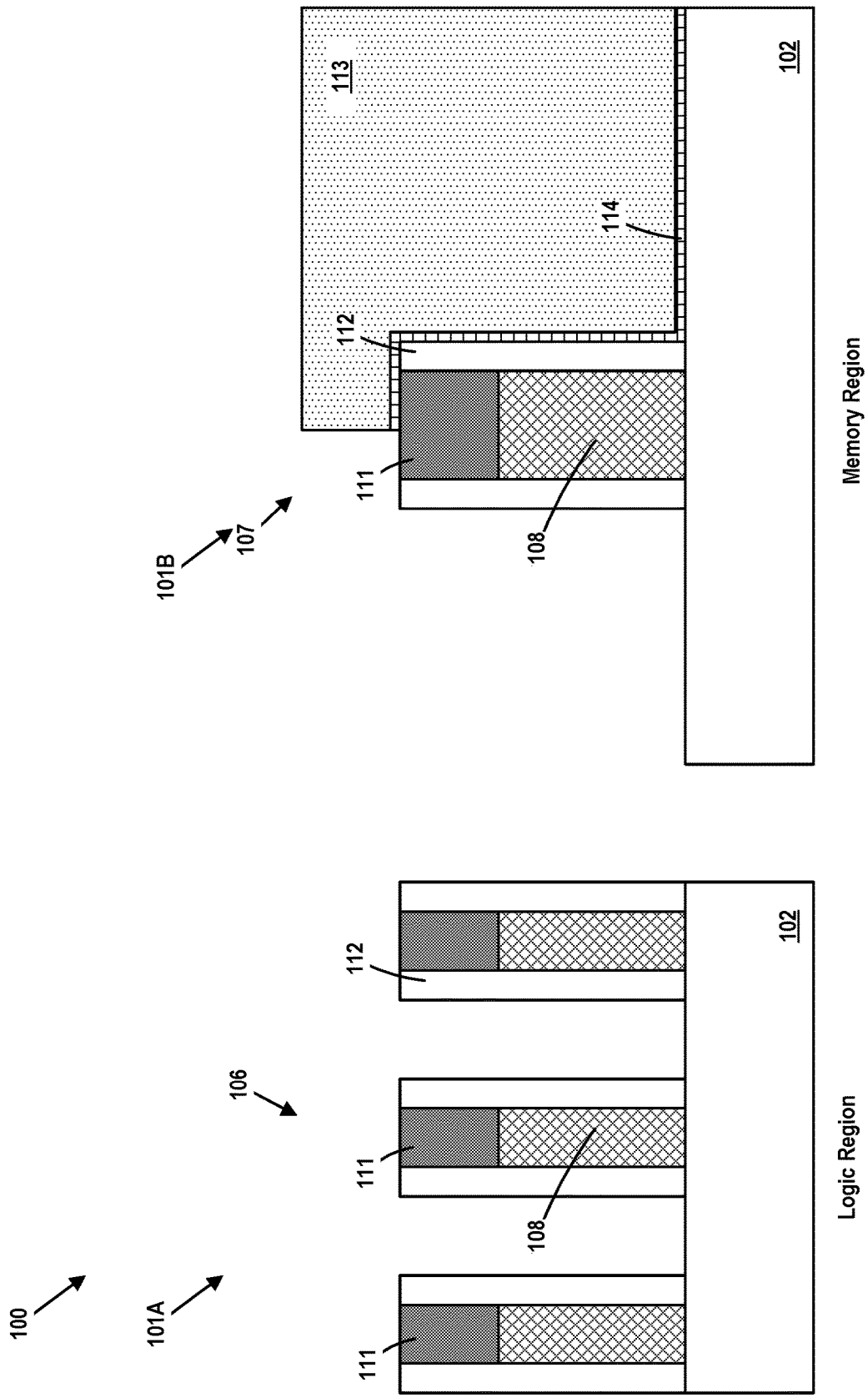

FIG. 4 depicts the IC product 100 after an etching process was performed through the patterned etch mask 113 to remove exposed portions of the conformal etch-stop layer 114. Thereafter, the patterned etch mask 113 may be removed.

Figure 5:
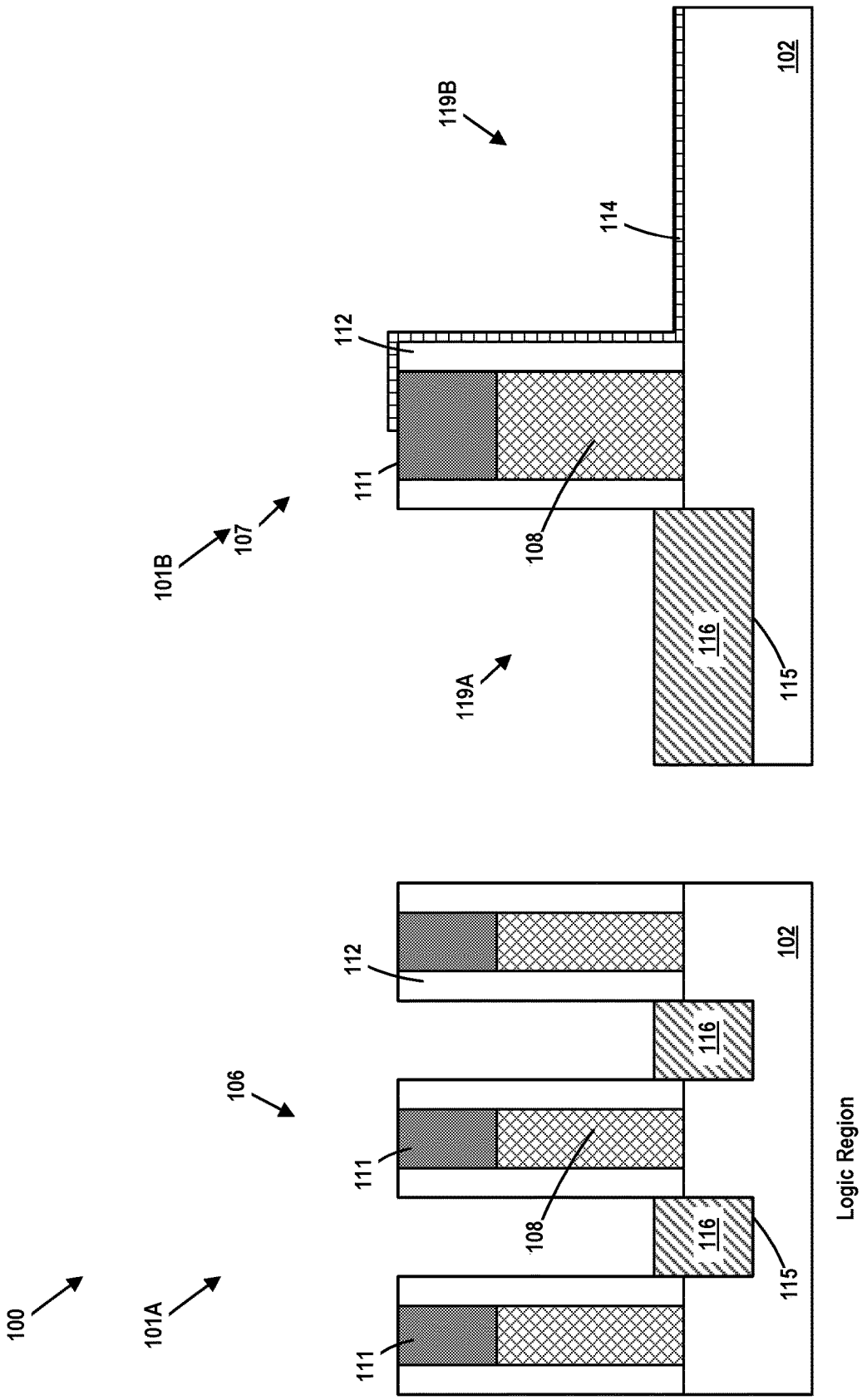

FIG. 5 depicts the IC product 100 after several process operations were performed. First, an etching process was performed to form epi cavities 115 in the substrate 102 in both the logic region and the memory region. The depth of the epi cavities 115 may vary depending upon the particular application. Next, epitaxial semiconductor material 116 was formed in the epi cavities 115 by performing an epitaxial growth process. In the case where the transistor devices 101A and the SG-memory devices 101B shown in FIG. 5 are N-type devices, the epitaxial semiconductor material 116 may be N-doped silicon, silicon-carbon, etc. In the case where the transistor devices 101A and the SG-memory devices 101B shown in FIG. 5 are P-type devices, the epitaxial semiconductor material 116 may be P-doped silicon, silicon-germanium, etc. The epi material 116 may be formed to any desired thickness. When completed, the SG-memory device 101B will have source/drain regions 119A-B. Note that, at this time, the epitaxial semiconductor material 116 has only been formed in the source/drain region 119A of the SG-memory device 101B.

Figure 6:
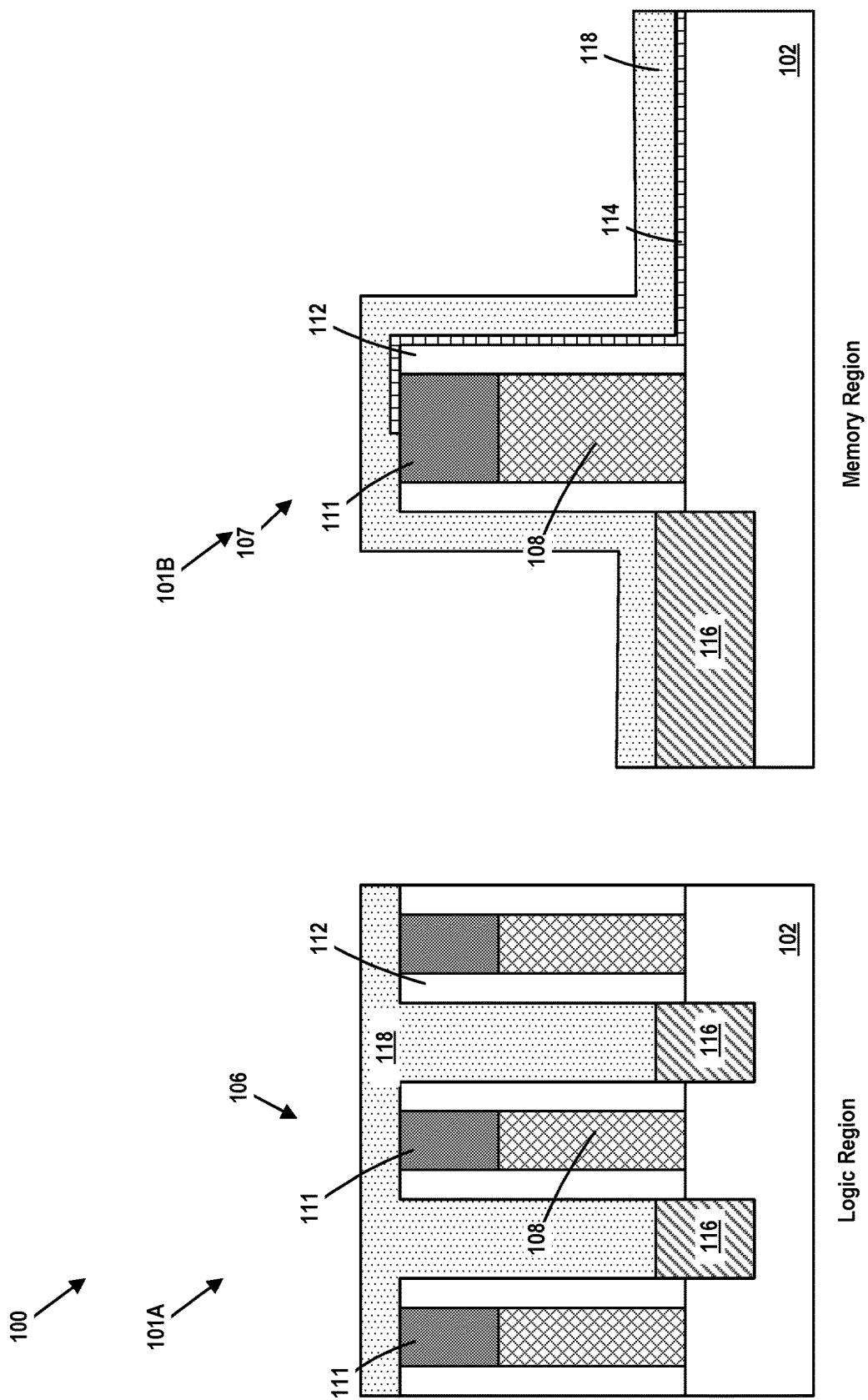

FIG. 6 depicts the IC product 100 after performing a conformal deposition process to form a conformal layer of material 118 above the substrate 102. The conformal layer of material 118 may be comprised of a variety of different materials, e.g., silicon dioxide, and it may be formed to any desired thickness, e.g., 10-20 nm. Note that, due to the tighter gate pitch in the logic region and the thickness of the conformal layer of material 118, the conformal layer of material 118 pinches off in the space between the gates 106 in the logic region.

Figure 7:
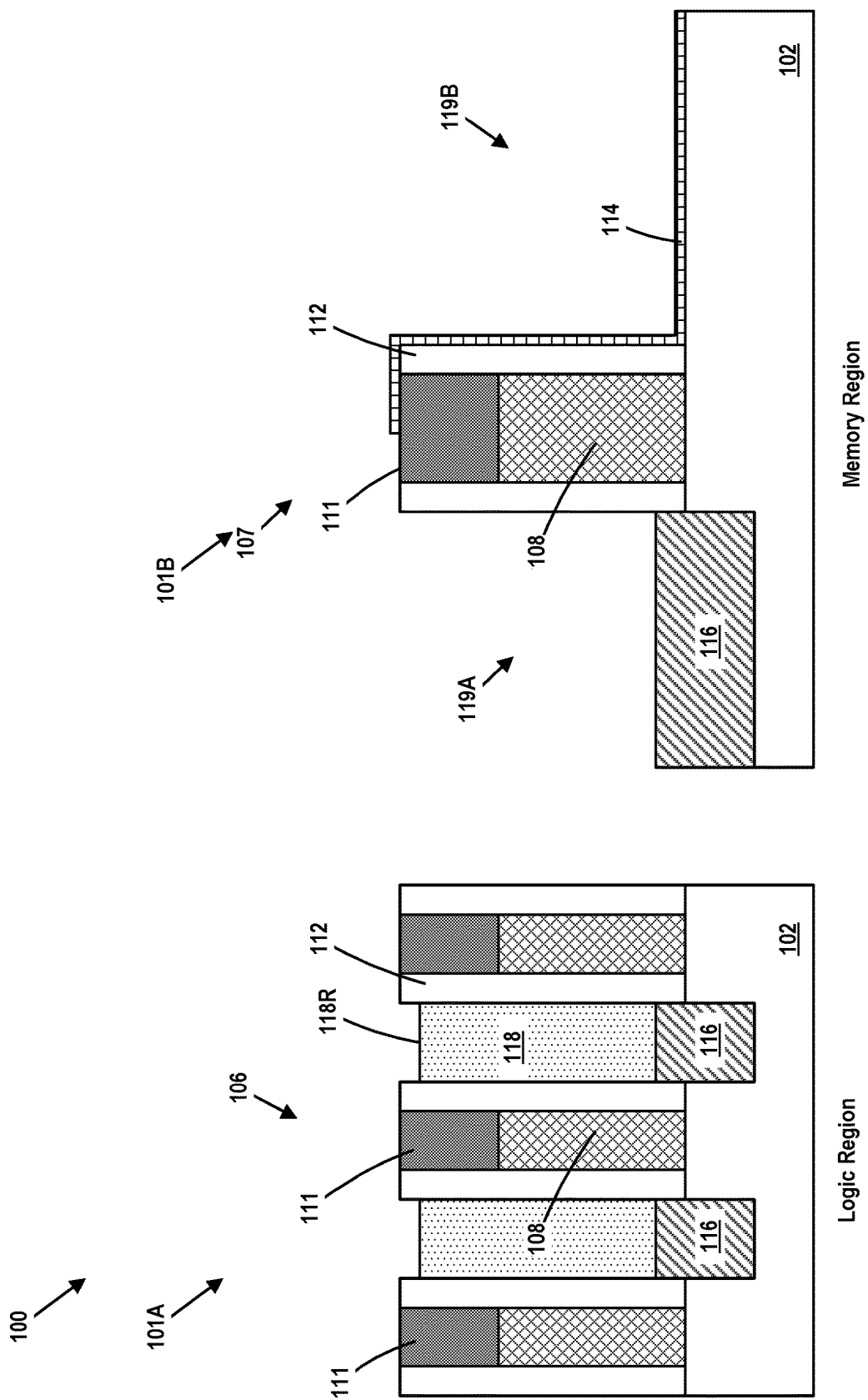

FIG. 7 depicts the IC product 100 after an isotropic etching process was performed to remove portions of the conformal layer of material 118. This etching process results in the removal of the conformal layer of material 118 in the memory region, while portions of the conformal layer of material 118 remain positioned between the gates 106 in the logic region. The material of the conformal layer of material 118 that remains in the logic region now has a recessed upper surface 118R.

Figure 8:
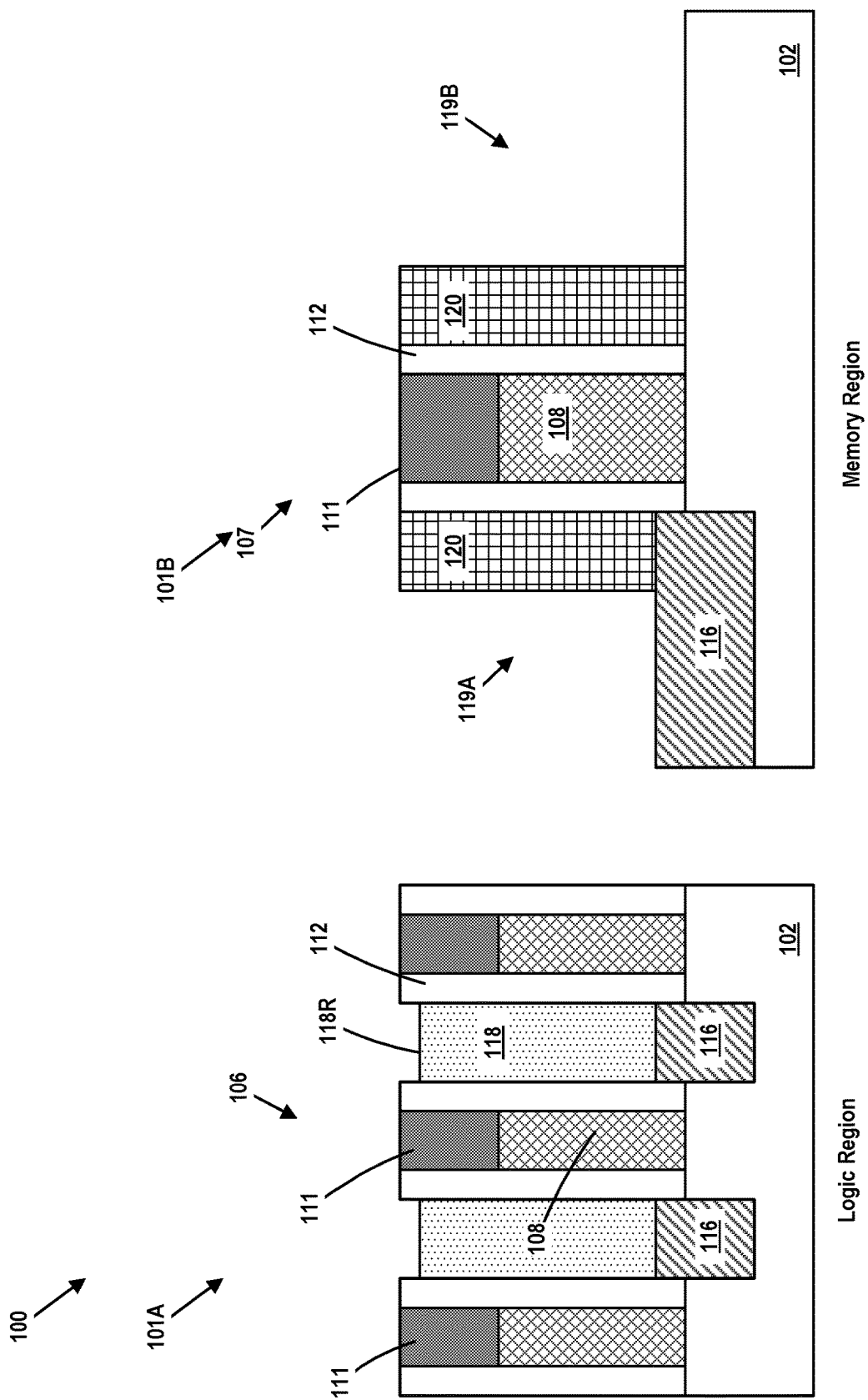

FIG. 8 depicts the IC product 100 after several process operations were performed. First, the etch-stop layer 114 was removed. Next, a relatively wide sidewall spacer 120 was formed adjacent the gate 107 of the SG-memory device 101B. The sidewall spacer 120 was formed by performing a conformal deposition process to form a conformal layer of spacer material above the substrate 102 and thereafter performing an anisotropic etching process. The lateral width of the spacer 120 at its base may vary depending upon the particular application, e.g., 10-80 nm. In one illustrative example, the spacer 120 may be comprised of a material such as, for example, silicon nitride.

Figure 9:
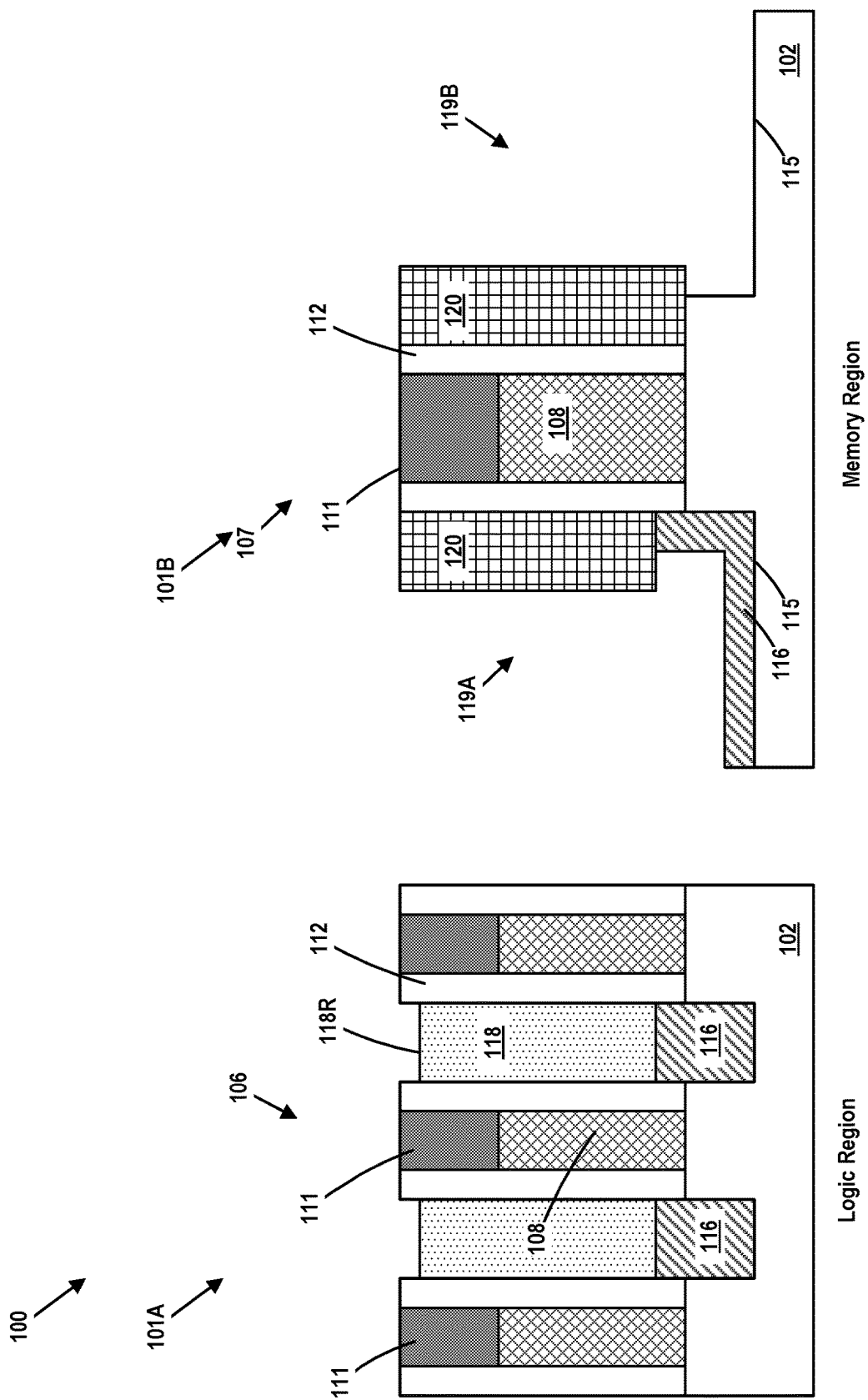

FIG. 9 depicts the IC product 100 after an etching process was performed to remove a portion of the epitaxial semiconductor material 116 in the source/drain region 119A of the SG-memory device 101B and to form another epi cavity 115 in the substrate 102 in the source/drain region 119B of the SG-memory device 101B. The etching process employed may have both isotropic and anisotropic characteristics, e.g., note the undercutting of the spacer 120.

Figure 10:
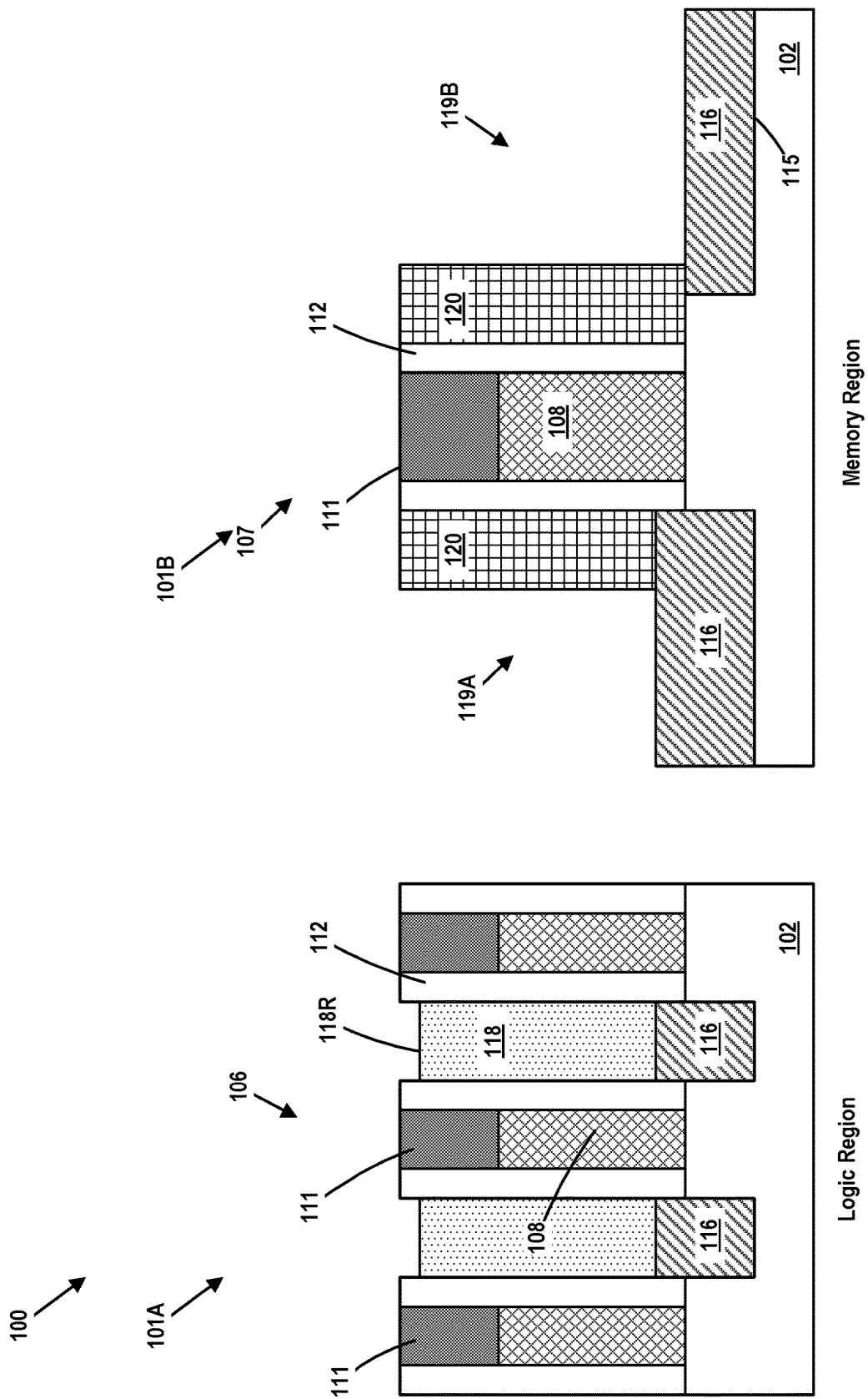

FIG. 10 depicts the IC product 100 after additional epitaxial semiconductor material 116 was formed in the epi cavities 115 in both of the source/drain regions 119A-B of the SG-memory device 101B.

Figure 11:
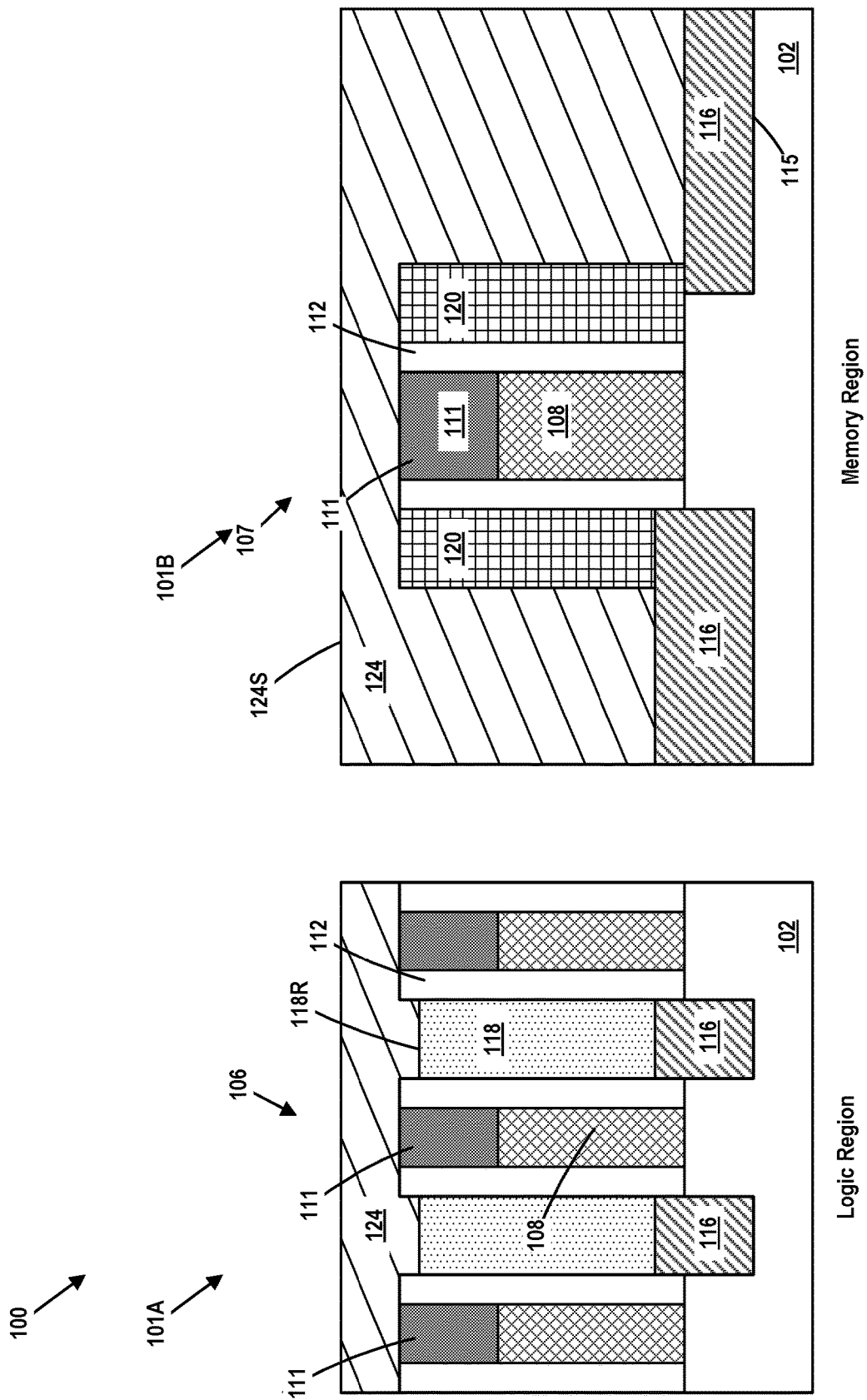

FIG. 11 depicts the IC product 100 after a layer of insulating material 124, e.g., an ILD layer, was formed above the substrate 102. The layer of insulating material 124 was formed such that its upper surface 124S is positioned above the upper surface of the gate hardmasks 111. The layer of insulating material 124 may be comprised of, for example, silicon dioxide, a low-k material, etc.

Figure 12:
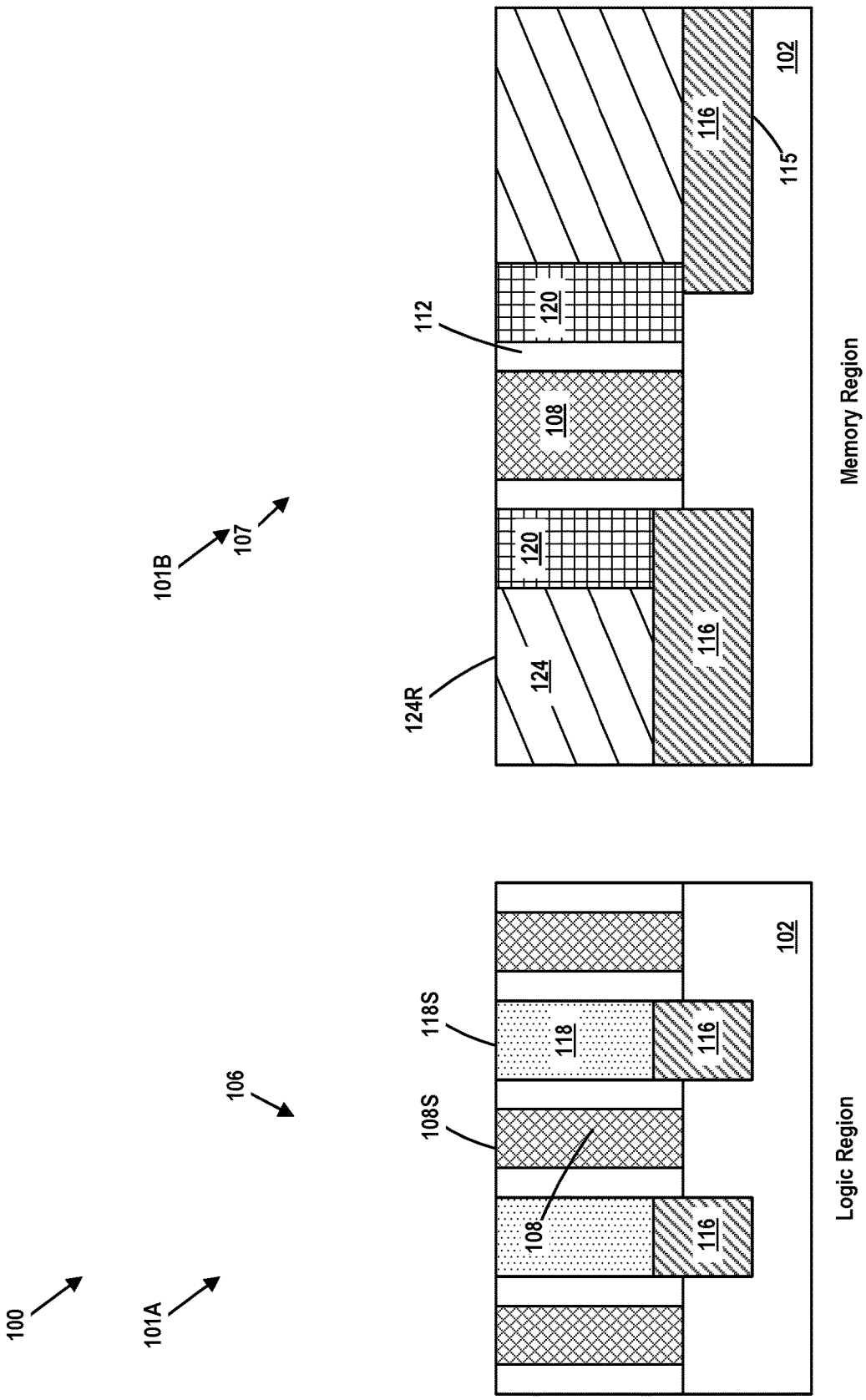

FIG. 12 depicts the IC product 100 after one or more chemical mechanical polishing (CMP) processes and/or etch-back processes were performed to remove portions of the layer of insulating material 124, portions of the sidewall spacer 120, portions of the sidewall spacer 112 and the gate hardmasks 111. These process operations result in the exposure of an upper surface 108S of the sacrificial gate structures 108 for the gates 106 and 107.

Figure 13:
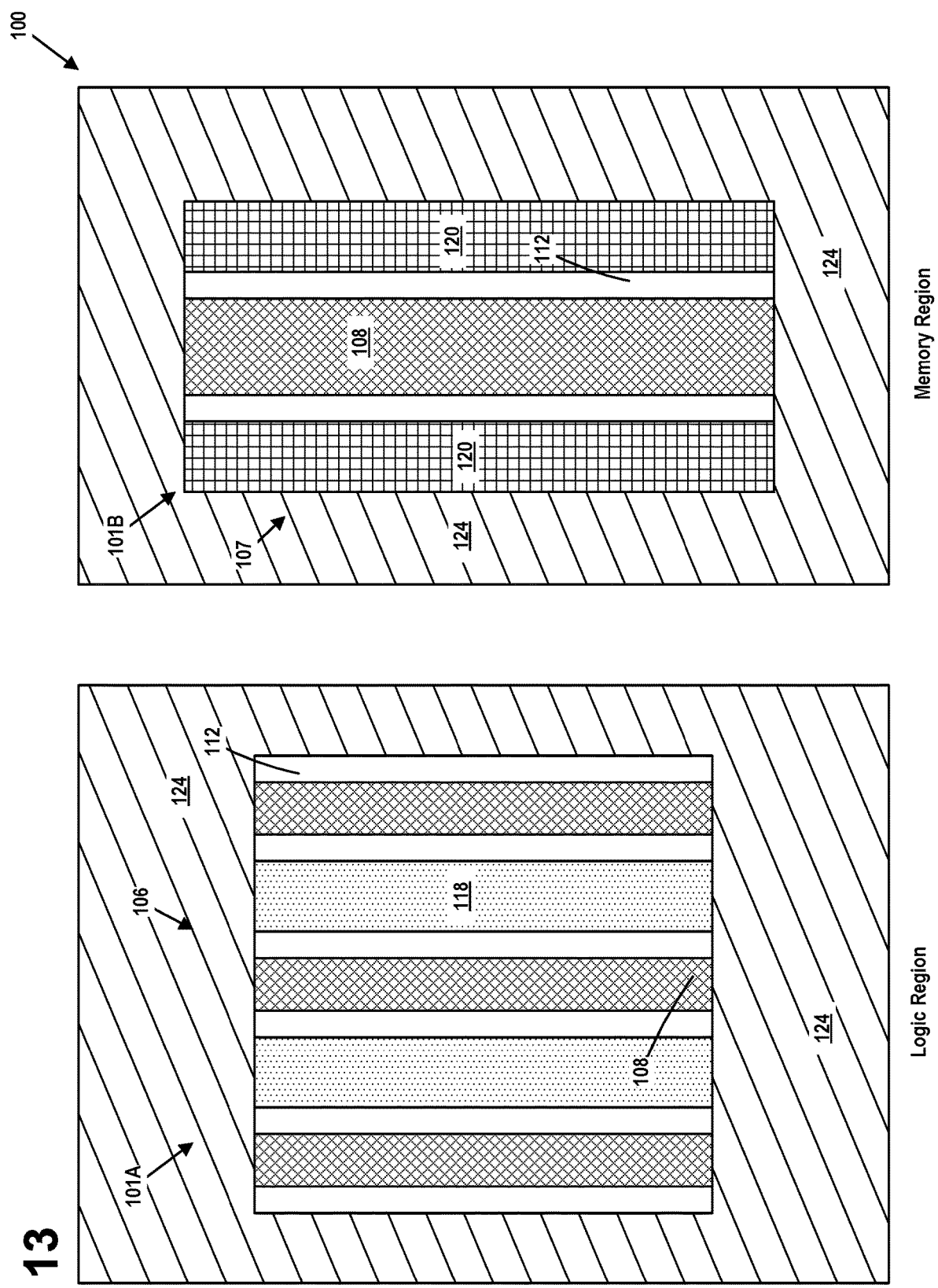

Next, in one illustrative embodiment, a gate-cut-last approach will be employed to cut the gates 106, 107 to their desired axial lengths, which may be different from one another. Accordingly, FIG. 13 is a simplistic plan view of the gates 106 and 107 after they have been cut and additional insulation material 124 has been deposited to fill the areas occupied by the removed portions of the gates 106 and 107. In the depicted example, the gates 106 in the logic region have a shorter axial length than the gate 107 in the memory region. The gate cutting process may be performed by forming an appropriate patterned etch mask on the product and thereafter performing one or more etching processes to remove the desired portions of the gates 106, 107.

Figure 14:
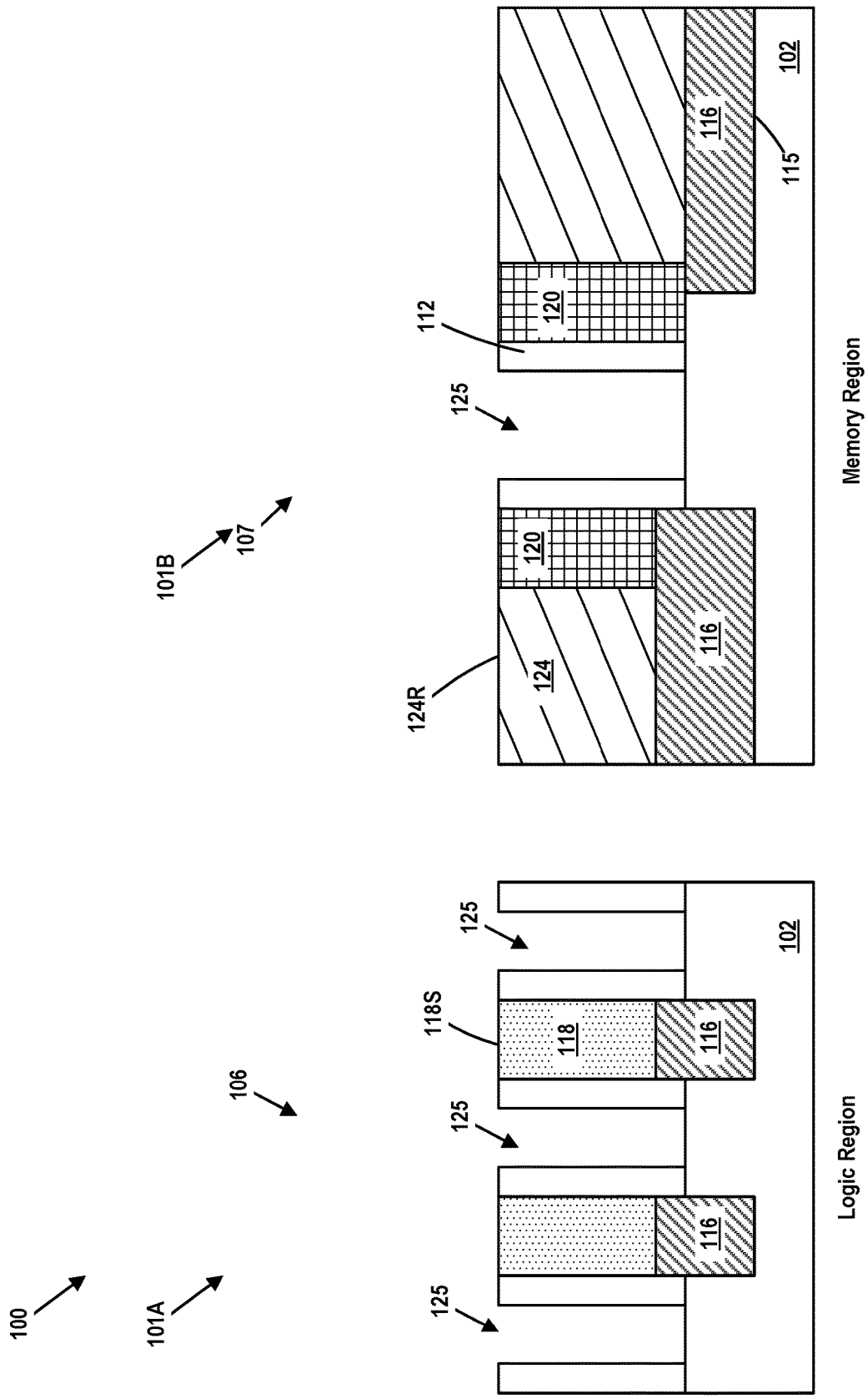

FIGS. 14-19 depict one illustrative process flow wherein the final transistor gate structures for the transistors 101A, the selection gate electrode 132 (CG) and a gate insulation layer 133 of the SG-memory device 101B will be formed prior to the formation of the memory gate electrode 142 (MG) and a plurality of insulating material layers 140 (described below) for the SG-memory device 101B. Accordingly, FIG. 14 depicts the IC product 100 after one or more etching processes were performed to remove the sacrificial gate structures 108 for the transistors 101A and the SG-memory device 101B. This results in the formation of a plurality of replacement gate cavities 125.

Figure 15:
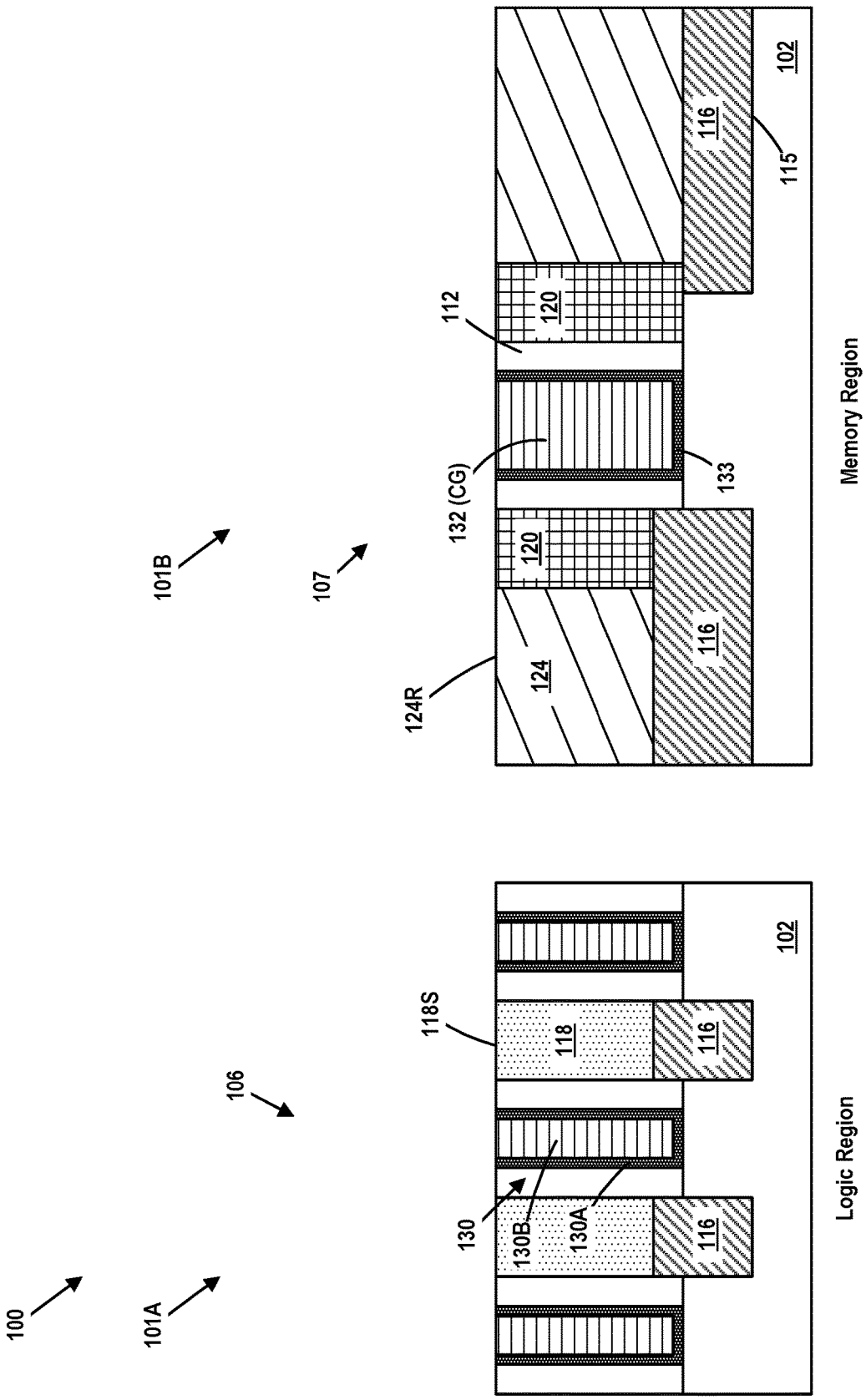

FIG. 15 depicts the IC product 100 after several process operations were performed to form simplistically depicted final replacement gate structures 130 in the gate cavities 125 for the transistors 101A and the selection gate electrode 132 (CG) and a gate insulation layer 133 were formed in the gate cavity 125 of the SG-memory device 101B. In one illustrative embodiment, each of the final replacement gate structures 130 comprises a high-k (k value of 10 or greater) gate insulation layer 130A and various conductive materials (not separately shown) 130B, i.e., one or more metal or metal-containing layers of material and/or polysilicon that function as the gate electrode 130B of the final replacement gate structures 130. In one particularly illustrative example, the gate insulation layer 130A and gate electrode 130B, respectively, of the gate structures 130 of the transistor devices 101A and the gate insulation layer 133 and the selection gate electrode 132 (CG), respectively, of the SG-memory devices 101B are made of the same materials. After the various materials were formed in the replacement gate cavities 125, one or more CMP process operations were then performed to remove excess portions of the materials positioned outside the replacement gate cavities 125. As mentioned above, this results in the formation of a selection gate electrode 132 (CG) and a gate insulation layer 133 for the SG-memory device 101B.

Figure 16:
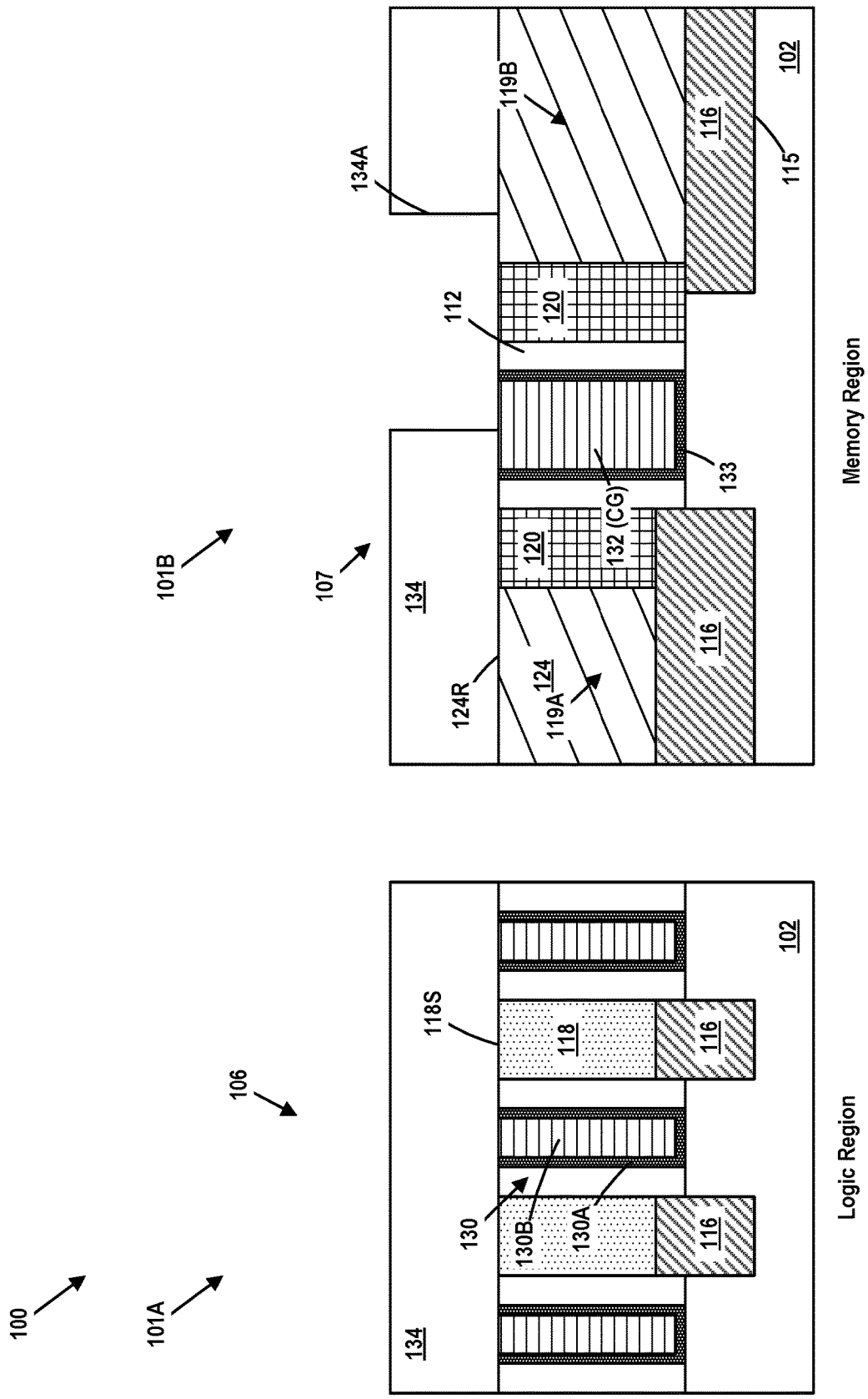

FIG. 16 depicts the IC product 100 after a patterned etch mask 134, e.g., a patterned layer of photoresist, OPL, etc., was formed on the IC product 100. The patterned etch mask 134 has an opening 134A that exposes portions of the sidewall spacer 112 and the sidewall spacer 120 that are positioned adjacent the selection gate electrode 132 and nearest the source/drain region 119B. The opening 134A also exposes a portion of the selection gate electrode 132 (CG) and the gate insulation layer 133.

Figure 17:
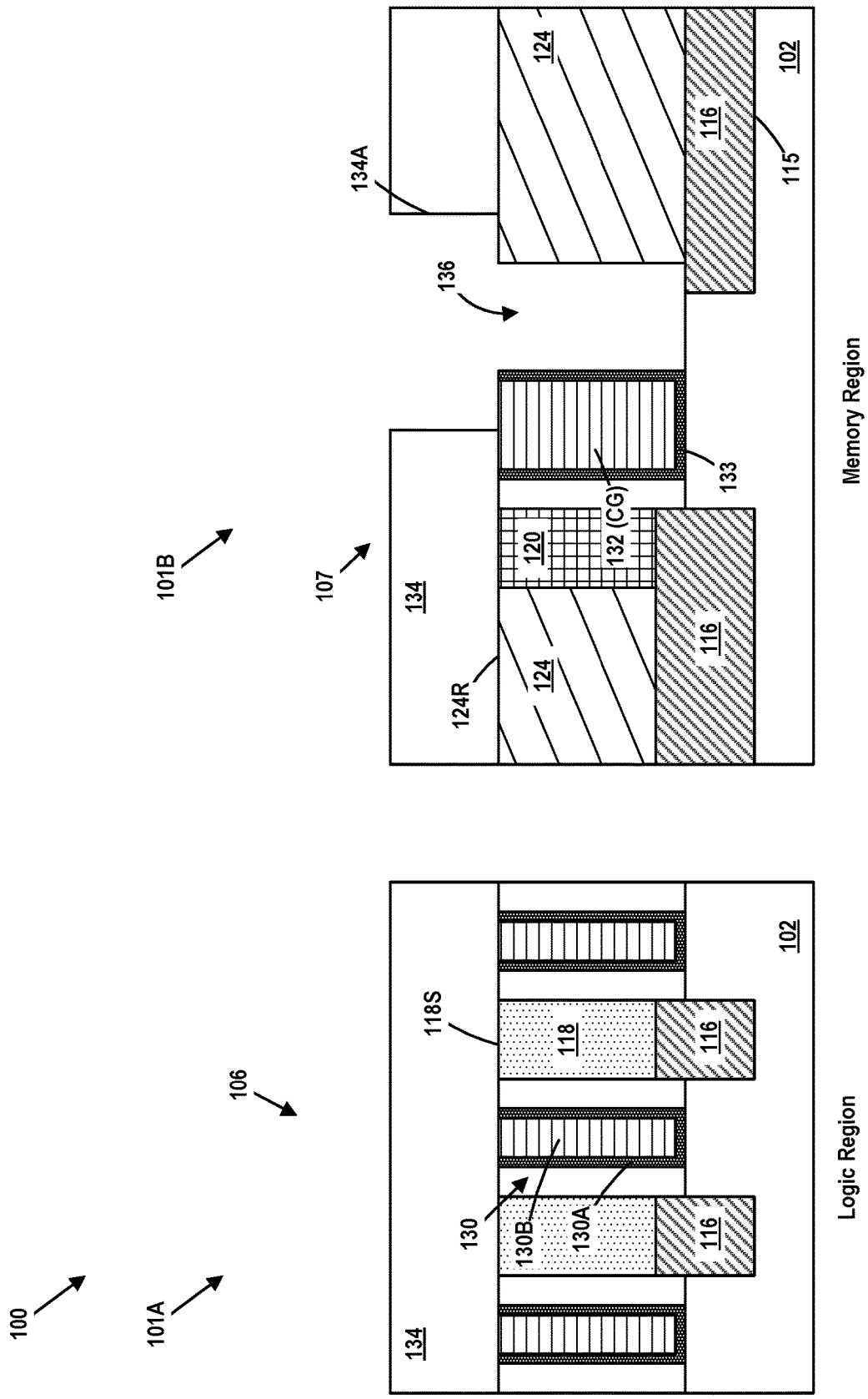

FIG. 17 depicts the IC product 100 after an etching process was performed to remove the exposed portions of the sidewall spacer 112 and the sidewall spacer 120 selectively relative to surrounding materials. This results in the formation of a memory gate cavity 136 for the SG-memory device 101B. Note that, in the depicted example, the formation of the memory gate cavity 136 is a self-aligning process.

Figure 18:
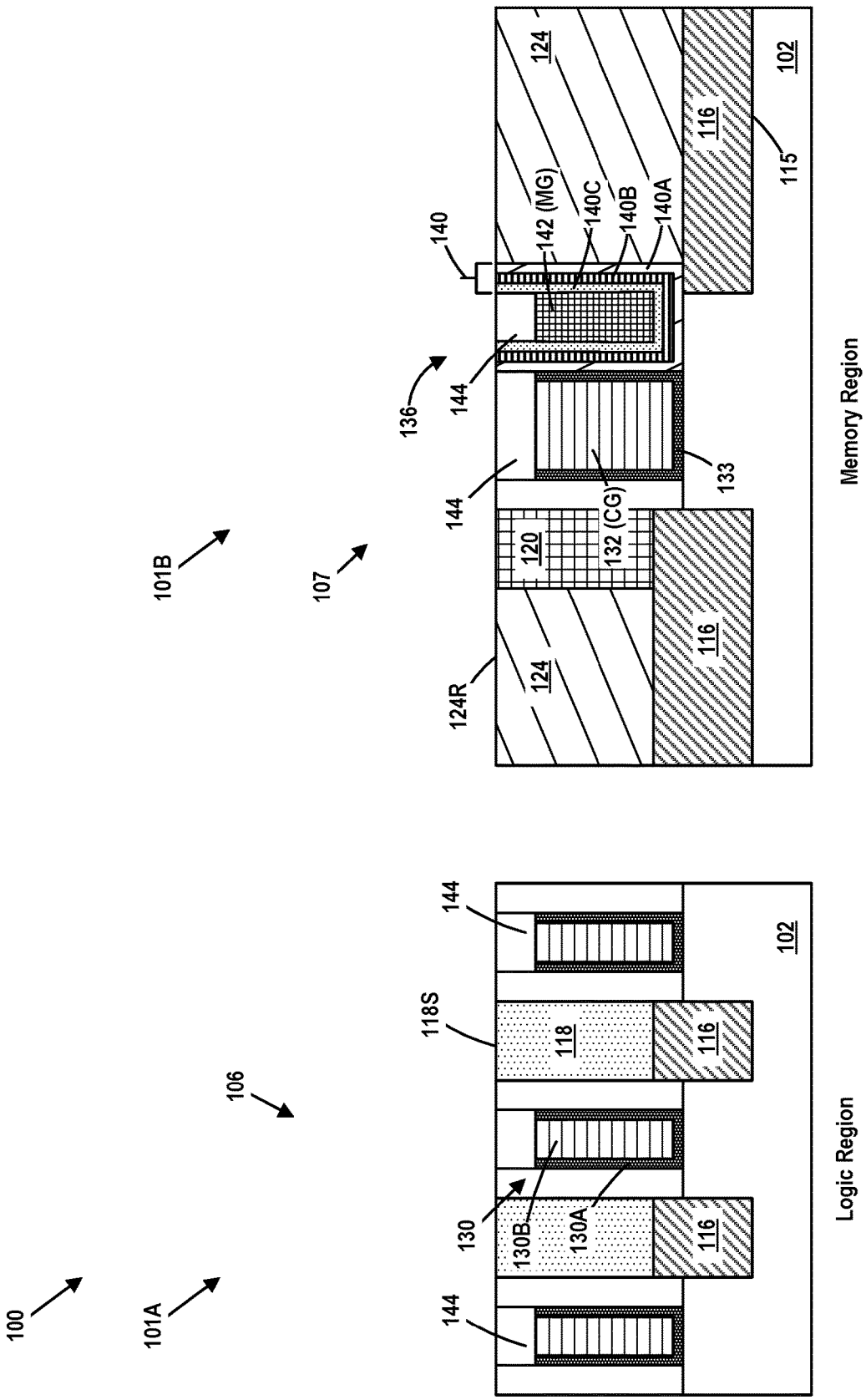

FIG. 18 depicts the IC product 100 after several process operations were performed. First, the patterned etch mask 134 (see FIG. 17) was removed. Next, various process operations were performed to form the memory gate electrode 142 (MG) and a plurality of layers of insulating material 140A, 140B 140C (collectively referenced using the numeral 140) in the memory gate cavity 136. In one illustrative example, a first conformal deposition process was performed to form a first conformal layer of insulating material 140A in the memory gate cavity 136. The first conformal layer of insulating material 140A may be comprised of a variety of different materials, e.g., silicon dioxide, and its thickness may vary depending upon the particular application, e.g., 2-10 nm. Next, a conformal deposition process was performed to form a second conformal layer of insulating material 140B on and in contact with the first conformal layer of insulating material 140A. The second conformal layer of insulating material 140B may be comprised of a variety of different materials, e.g., silicon nitride, and its thickness may vary depending upon the particular application, e.g., 5-20 nm. Thereafter, another conformal deposition process was performed to form a third conformal layer of insulating material 140C on and in contact with the second conformal layer of insulating material 140B. The third conformal layer of insulating material 140C may be comprised of a variety of different materials, e.g., silicon dioxide, and its thickness may vary depending upon the particular application, e.g., 5-15 nm.

In one illustrative example, the first conformal layer of insulating material 140A may be made of silicon dioxide and may function as a tunneling oxide layer of the SG-memory device 101B. In one illustrative example, the second conformal layer of insulating material 140B may be made of silicon nitride and may function as a charge storage layer of the SG-memory device 101B. In one illustrative example, the third conformal layer of insulating material 140C may be made of silicon dioxide and may function as an insulating oxide layer of the SG-memory device 101B.

With continuing reference to FIG. 18, one or more conductive material layers for the memory gate electrode 142 (MG) were then formed above the second conformal layer of insulating material 140B and within the remaining unfilled portions of the memory gate cavity 136. In one illustrative embodiment, the memory gate electrode 142 (MG) may be comprised of any suitable metals, such as TiN, TaN, Pt, Al, W, Ru, Co, Cu, or heavily doped silicon, silicided polysilicon, etc. After the materials of the memory gate electrode 142 (MG) were formed in the memory gate cavity 136, one or more CMP process operations were then performed to remove excess portions of the materials of the memory gate electrode 142 (MG) and the insulating layers 140 positioned outside the memory gate cavity 136. As mentioned above, this results in the formation of the memory gate electrode 142 (MG) for the SG-memory device 101B as well as the conformal layers of insulating material 140 positioned around the memory gate electrode 142 (MG). Note that, when viewed in a cross-section taken through the memory gate electrode 142 (MG) in a direction corresponding to the gate length direction, all of the insulating material layers 140A, 140B and 140C have a unique generally U-shaped configuration. Similarly, the gate insulation layer 133 positioned on the selection gate electrode 132 (CG) of the SG-memory device 101B also has a unique generally U-shaped configuration when viewed in a similar cross-sectional view taken through the selection gate electrode 132 (SG).

With continuing reference to FIG. 18, in some applications, various protective gate hardmasks 144 may be formed above the final gate structures 130 of the transistor devices 101A and the selection gate electrode 132 (CG) and the gate insulation layer 133 of the SG-memory device 101B. A protective gate hardmask 144 may also be formed over at least the memory gate electrode 142 (MG). However, in other applications, the formation of such protective gate hardmasks 144 may be omitted entirely, i.e., the gate hardmasks 144 may not be formed in either the logic region or the memory region. To the extent that such gate hardmasks 144 are formed, a timed, recess etching process was performed to recess the materials of the final replacement gate structures 130 of the transistor devices 101A, the selection gate electrode 132 (CG), the gate insulation layer 133 and the memory gate electrode 142 (MG) so as to thereby make room for the gate hardmasks 144 to be formed above the recessed materials. The gate hardmasks 144 may be formed by depositing a layer of gate hardmask material, e.g., silicon nitride, across the substrate and above the recessed materials of the final replacement gate structures and thereafter performing a CMP process to remove the excess gate hardmask material.

Figure 19:
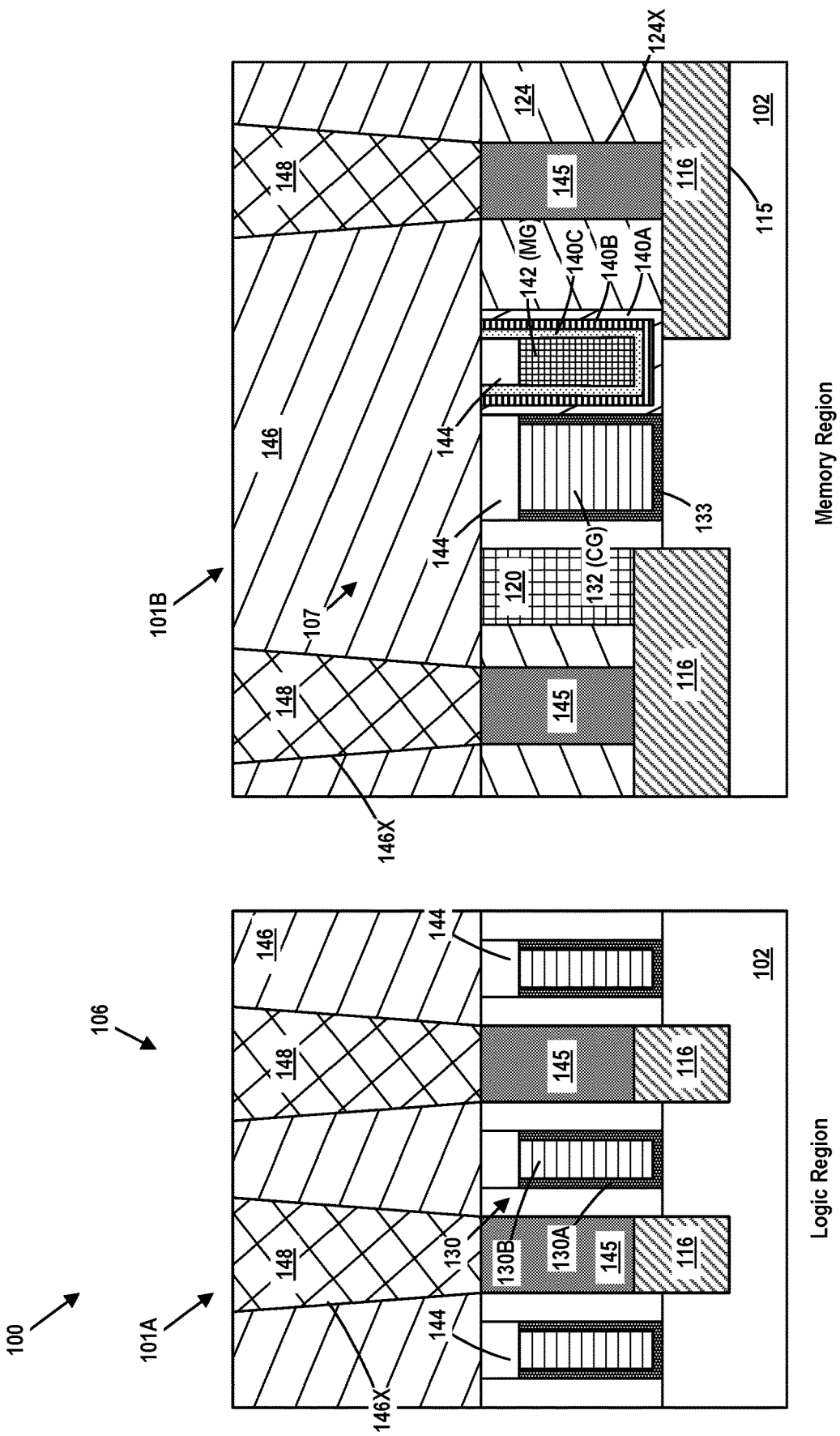

FIG. 19 depicts the IC product 100 after several process operations were performed. First, an etching process was performed to remove the insulating material 118 (see FIG. 18) between the gates 106 in the logic region so as to thereby expose the epi material 116 in the logic region and to form openings 124X in the insulating material 124 so as to thereby expose at least portions of the epi material 116 in the memory region. At that point, conductive source/drain structures 145, e.g., trench silicide containing regions, were formed so as to contact the epi material 116. The configuration and structure of the conductive source/drain structures 145 may vary depending upon the particular application. In one example, the conductive source/drain structures 145 are line-type structures that extend into and out of the plane of the drawing page in FIG. 18 that extend for substantially the entire length of the active region (in a direction that corresponds to the gate width direction of the device). In some cases, the conductive source/drain structures 145 comprise a trench metal silicide material (not separately shown) that is formed on and in contact with the epi material 116, and a metal material, such as tungsten (not separately shown), that is formed on and in contact with the trench metal silicide material. After the formation of the materials that make up the conductive source/drain structures 145, a chemical mechanical polishing (CMP) process was performed to remove excess materials located above the upper surface of the gate hardmasks 144.

Still referencing FIG. 19, additional insulating material 146, e.g. silicon dioxide, a low-k material, was formed on the IC product. At that point, openings 146X were formed in the layer of insulating material 146 so as to expose a portion of the conductive source/drain structures 145. Thereafter, conductive source/drain contact structures 148 were formed in the openings 146X. Conductive gate contact structures (not shown) may also be formed at this time to contact the various gate structures on the IC product 100. The conductive source/drain contact structures 148 may be comprised of a variety of different materials and they may be formed by performing various manufacturing techniques. In one illustrative example, one or more conformal barrier layers and/or seed layers (not separately shown) were formed so as to line the contact openings 146X, and one or more conductive materials (e.g., copper, a metal-containing material, a metal compound, etc.) were then formed on the product 100 so as to overfill the openings 146X. At that point, a CMP process was performed to remove excess portions of the conductive materials from above the upper surface of the layer of insulating material 146. The conductive source/drain contact structures 148 conductively contact the upper surface of the underlying conductive source/drain structure 145.

Figure 20:
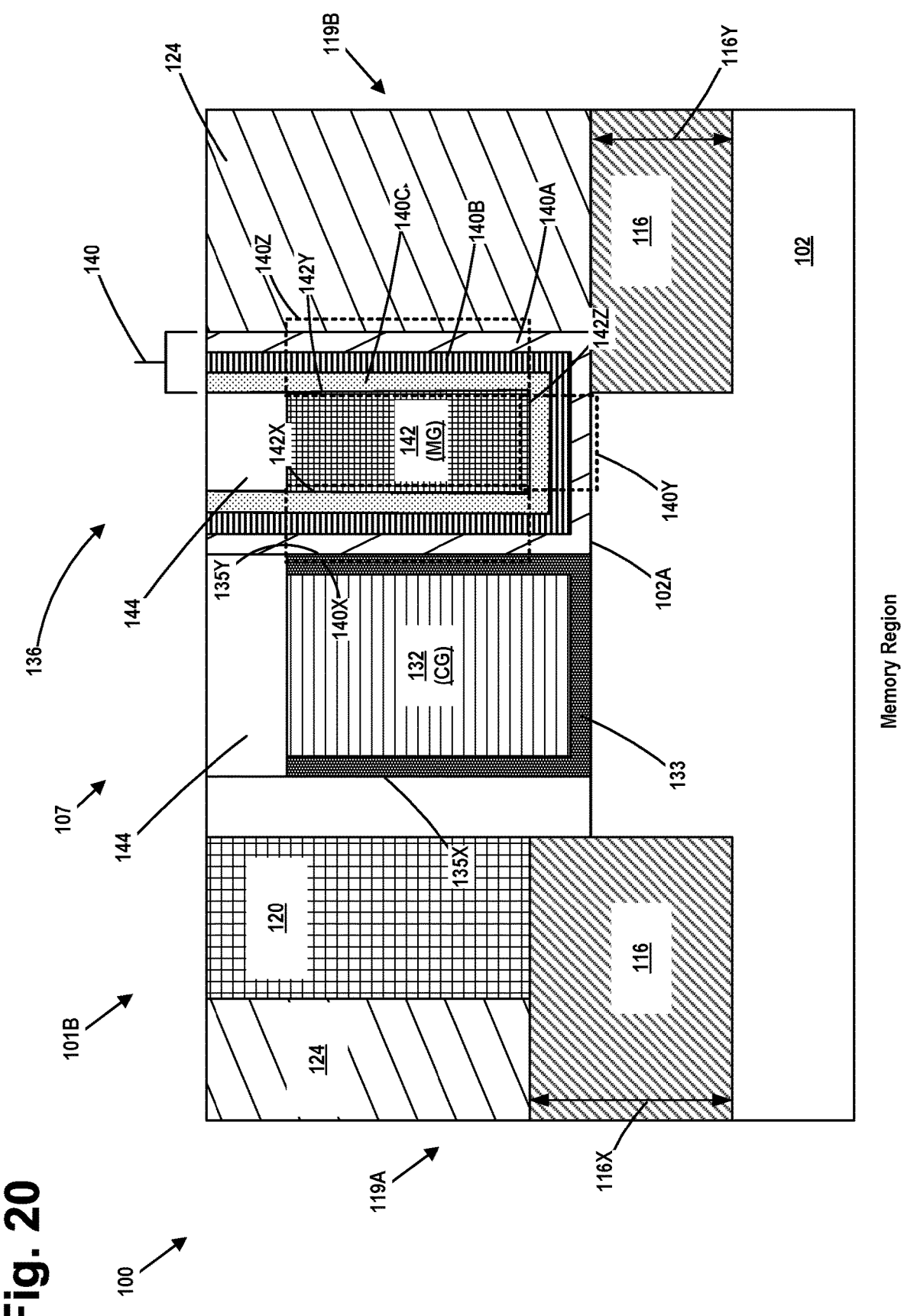
Figure 21:
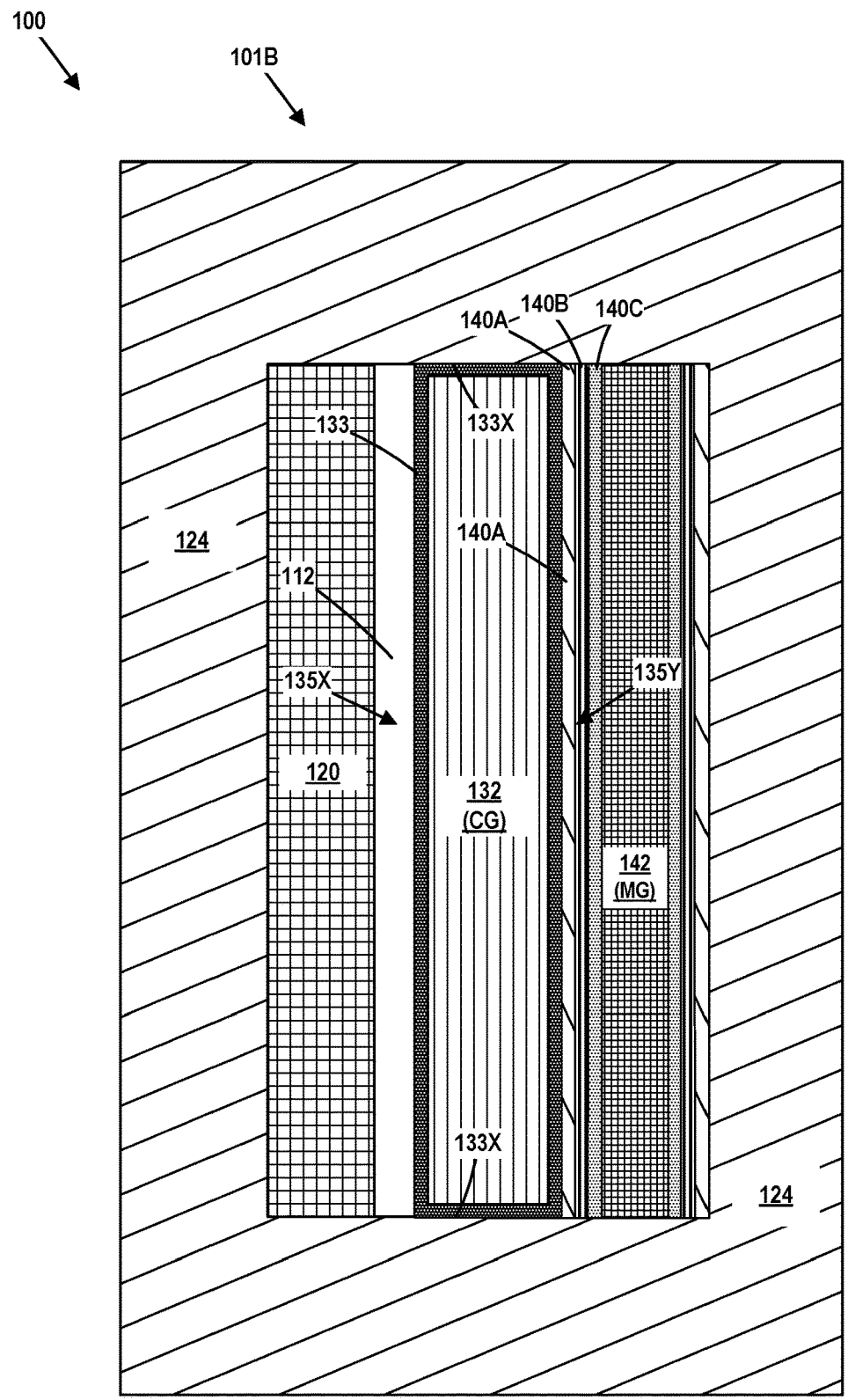

FIG. 20 is an enlarged cross-sectional view of the SG-memory device 101B. FIG. 21 is an enlarged plan view of the SG-memory device 101B with the gate hardmasks 144 removed. As depicted, the memory gate electrode 142 (MG) is positioned adjacent the selection gate electrode 132 (CG). Moreover, as shown in FIG. 20, when viewed in a cross section taken in the gate length direction, the memory gate electrode 142 (MG) comprises first and second opposing sidewall surfaces 142X, 142Y and a bottom surface 142Z. In some embodiments, the first and second opposing sidewall surfaces 142X, 142Y may be substantially vertically oriented relative to the upper surface 102A of the substrate 102. Considered collectively, a first portion (within the dashed line region 140X) of the plurality of layers of insulating material 140 is positioned between the selection gate electrode 132 (CG) and the first opposing sidewall surface 142X of the memory gate electrode 142 (MG), a second portion (within the dashed line region 140Y) of the plurality of layers of insulating material 140 is positioned between the bottom surface 142Z of the memory gate electrode 142 (MG) and the upper surface 102A of the semiconductor substrate 102 and a third portion (within the dashed line region 140Z) of the plurality of layers of insulating material 140 is positioned on the second opposing sidewall 142Y of the memory gate electrode 142 (MG). A portion of the conformal layers of insulating material 140 (considered collectively) also contacts and engages the gate insulation layer 133 on the selection gate electrode 132 (CG) for substantially the entire height of the gate insulation layer 133. More specifically, a portion of the first conformal layer of insulating material 140A contacts and engages the gate insulation layer 133 for substantially the entire height of the gate insulation layer 133. Another portion of the first conformal layer of insulating material 140A contacts and engages the upper surface 102A of the substrate 102.

Additionally, an outer surface of the second conformal layer of insulating material 140B is positioned on and in contact with the inner surface of the first conformal layer of insulating material 140A. The outer surface of the third conformal layer of insulating material 140C is positioned on and in contact with the inner surface of the second conformal layer of insulating material 140B. The inner surface of the third conformal layer of insulating material 140C is positioned on and in contact with the first opposing sidewall surface 142X, the second opposing sidewall 142Y and the bottom surface 142Z of the memory gate electrode 142 (MG).

FIGS. 20 and 21 depict another unique structure for the SG-memory device 101B. The selection gate electrode 132 (CG) and the gate insulation layer 133 define a overall gate structure that has first and second opposing lateral sidewalls 135X, 135Y. The combination of the inner spacer 112 and the outer spacer 120 are positioned adjacent only one of the opposing lateral sidewalls, e.g., the sidewall 135X of the overall gate structure. This is the result of the etching step that was performed to form the memory gate cavity 136 as shown in FIG. 17.

Returning to FIG. 20, the region of epitaxial semiconductor material 116 positioned in the first source drain region 119A is partially positioned under the second sidewall spacer 120 and it has a first vertical thickness 116X. The second region of epitaxial semiconductor material 116 positioned adjacent the memory gate electrode 142 (MG) has a second vertical thickness 116Y, wherein the first vertical thickness 116X is greater than the second vertical thickness 116Y. In one illustrative example, the difference between the thicknesses 116X and 116Y may be about 0-20 nm.

Figure 22:
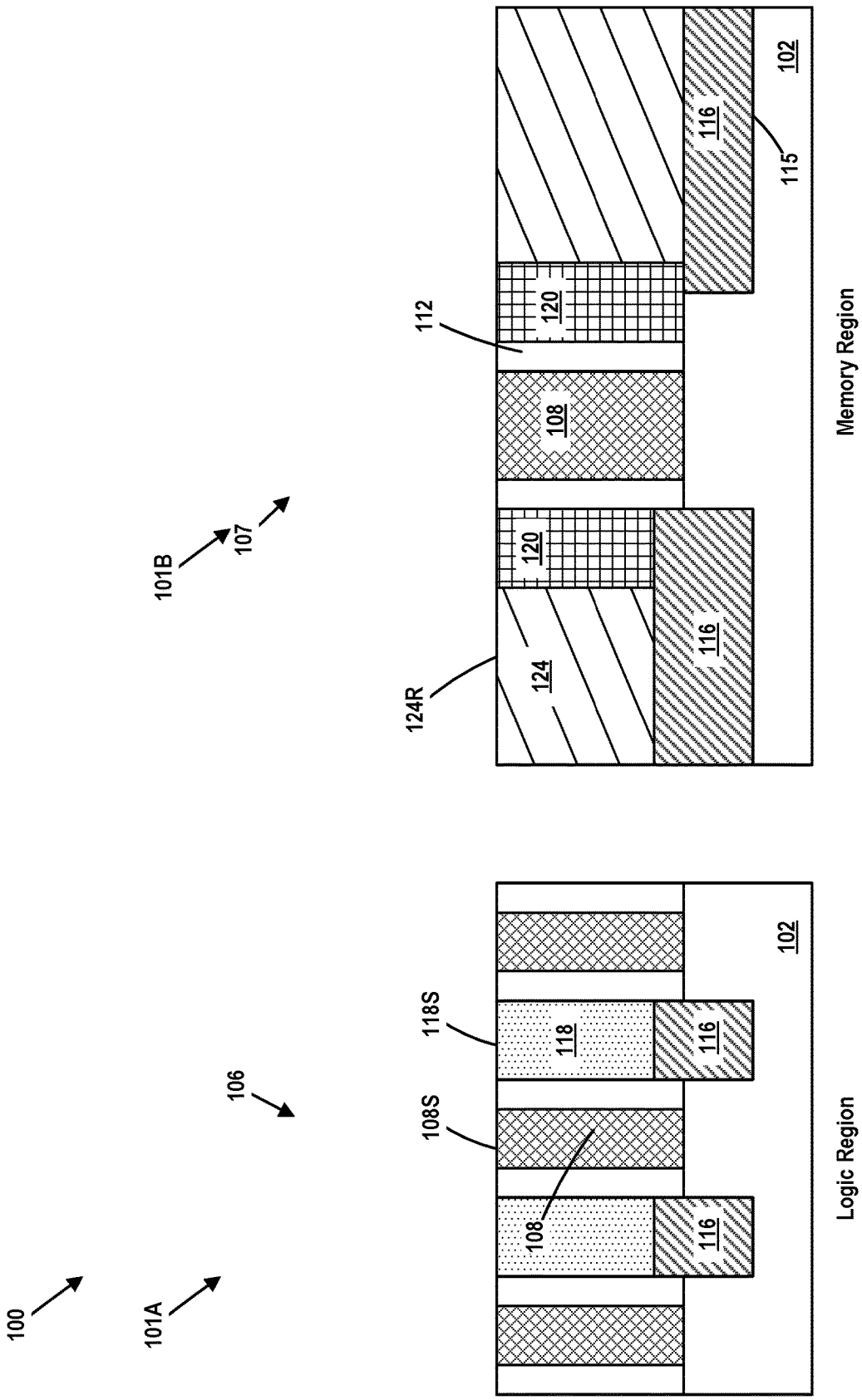

FIGS. 22-27 depict yet another illustrative process flow that may be employed to form the IC products 100 disclosed herein. However, in this illustrative process flow, the memory gate electrode 142 (MG) and the plurality of layers of insulating material 140 for the SG-memory device 101B will be formed prior to the formation of the final gate structures 130 for the transistors 101A, the selection gate electrode 132 (CG) and the gate insulation layer 133 of the SG-memory device 101B. FIG. 22 corresponds to the point of fabrication shown in FIG. 13, i.e., after removal of the gate hardmasks 111.

Figure 23:
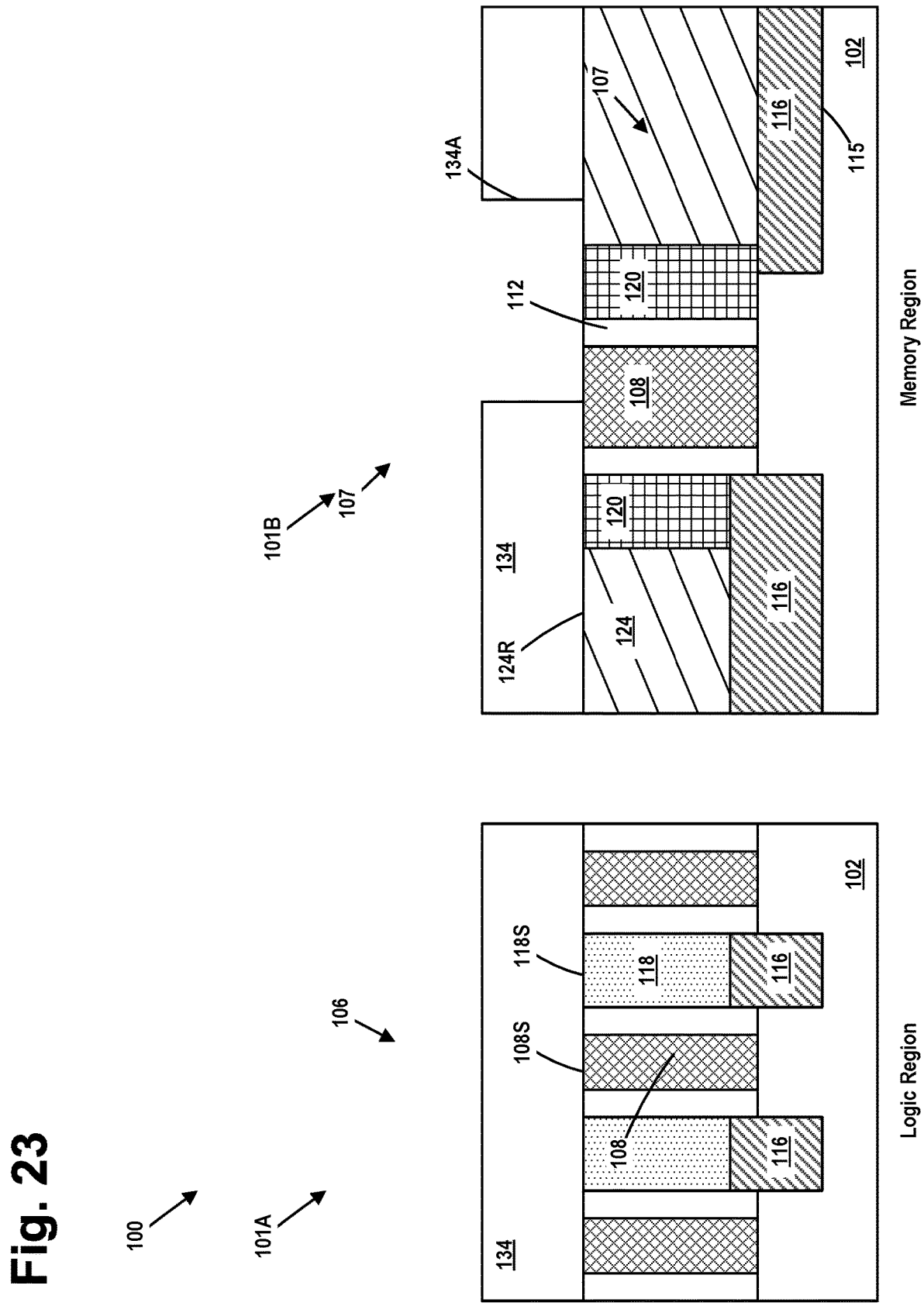

FIG. 23 depicts the IC product 100 after the above-described patterned etch mask 134 was formed on the IC product 100. As before, the patterned etch mask 134 has an opening 134A that exposes a portion of the sidewall spacer 112 and a portion of the sidewall spacer 120 that are positioned adjacent the sacrificial gate structure 108 for the selection gate electrode 132 (CG) and nearest the source/drain region 119B. The opening 134A also exposes a portion of the sacrificial gate electrode of the sacrificial gate structure 108 for the selection gate electrode 132 of the SG-memory device 101B.

Figure 24:
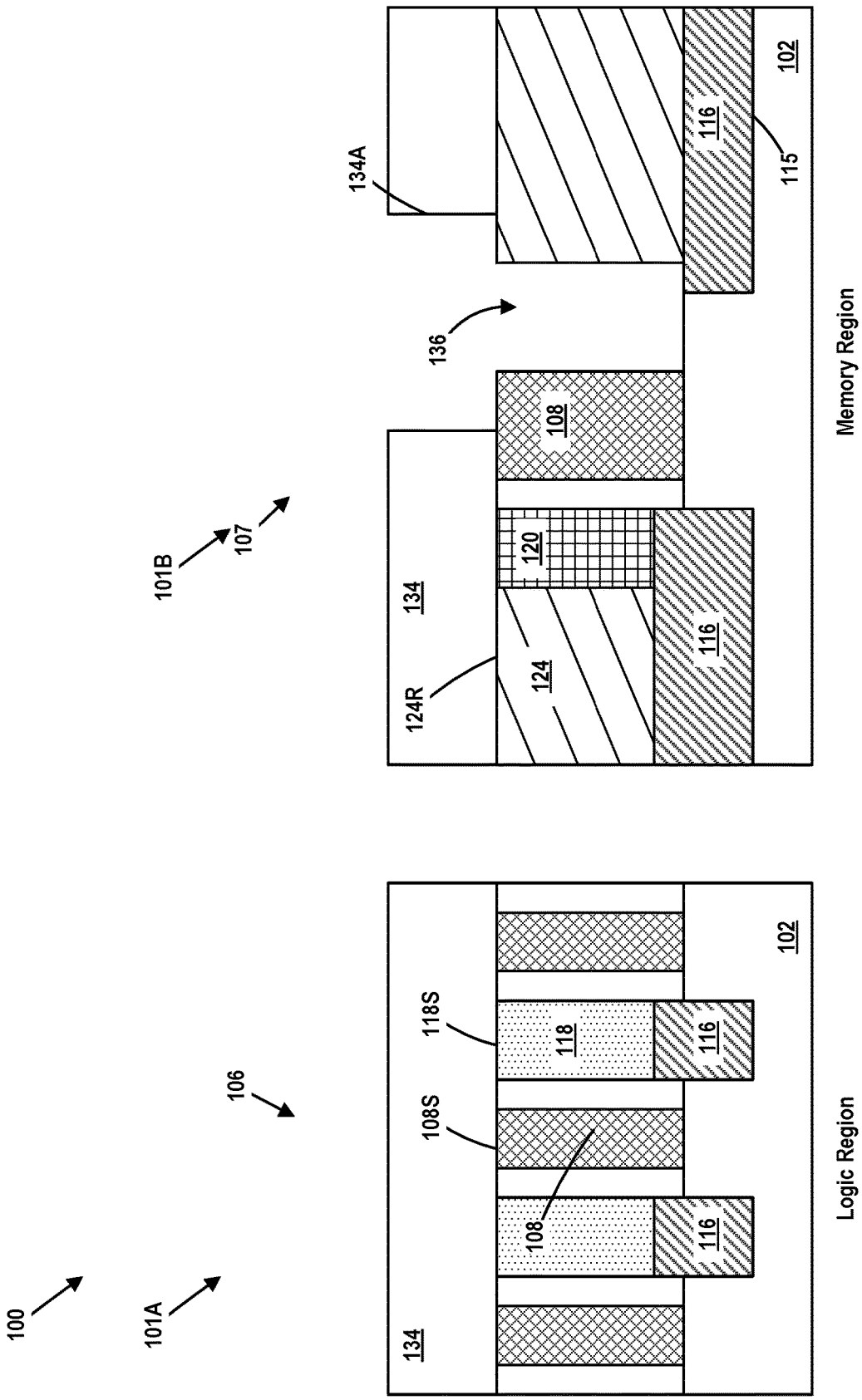

FIG. 24 depicts the IC product 100 after an etching process was performed to remove the exposed portions of the sidewall spacer 112 and the sidewall spacer 120 selectively relative to surrounding materials. This results in the formation of the above-described memory gate cavity 136 for the SG-memory device 101B. Note that, in the depicted example, the formation of the memory gate cavity 136 is a self-aligning process and that the memory gate cavity 136 exposes a portion of the sidewall of the sacrificial gate structure 108.

Figure 25:
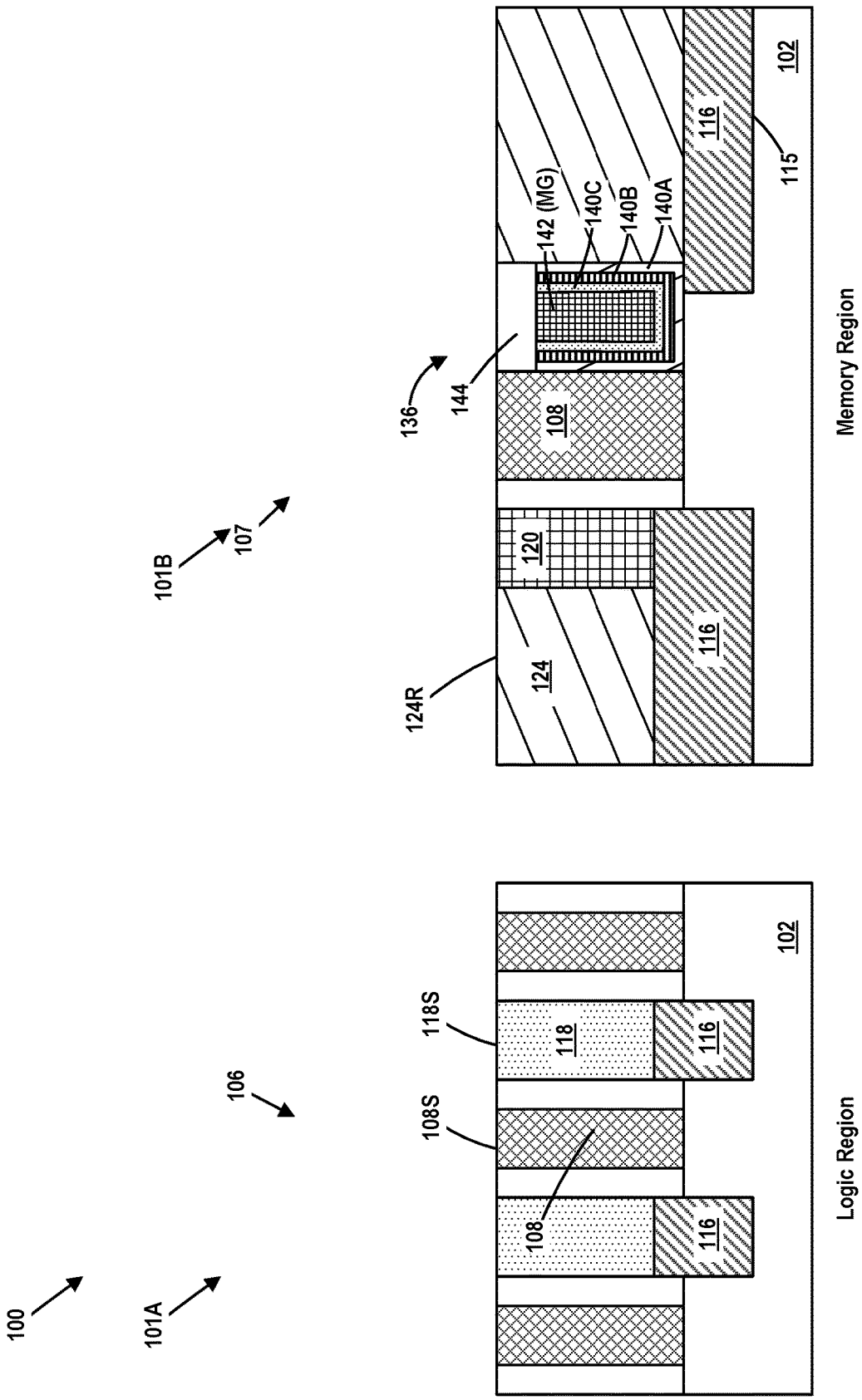

FIG. 25 depicts the IC product 100 after several process operations were performed. First, the patterned etch mask 134 (see FIG. 24) was removed. Next, various process operations were performed to form the above-described memory gate electrode 142 (MG) and the plurality of layers of insulating material 140 in the memory gate cavity 136. That is, the above-described first conformal layer of insulating material 140A, the above-described second conformal layer of insulating material 140B, the above-described third conformal layer of insulating material 140C and the materials for the above-described memory gate electrode 142 (MG) were sequentially formed in the memory gate cavity 136. As before, after the materials of the memory gate electrode 142 (MG) were formed in the memory gate cavity 136, one or more CMP process operations were then performed to remove excess portions of the materials of the memory gate electrode 142 (MG) and the plurality of layers of insulating material 140 positioned outside the memory gate cavity 136. Note that, as before, when viewed in a cross-section taken through the memory gate electrode 142 (MG) in a direction corresponding to the gate length direction, the layers of insulating material 140A, 140B and 140C each have a unique generally U-shaped configuration.

With continuing reference to FIG. 25, and as noted above, in some applications, a protective gate hardmask 144 may be formed above the memory gate electrode 142 (MG) as depicted in FIG. 23. In the situation depicted in FIG. 25, all of the materials of the memory gate electrode 142 (MG) and all of the plurality of layers of insulating material 140 were recessed to make room for the protective gate hardmask 144. As before, the gate hardmask 144 shown in FIG. 25 may be formed by depositing a layer of gate hardmask material, e.g., silicon nitride, across the substrate 102 and above the recessed materials of the memory gate electrode 142 (MG) and the recessed plurality of layers of insulating material 140 and thereafter performing a CMP process to remove the excess gate hardmask material.

Figure 26:
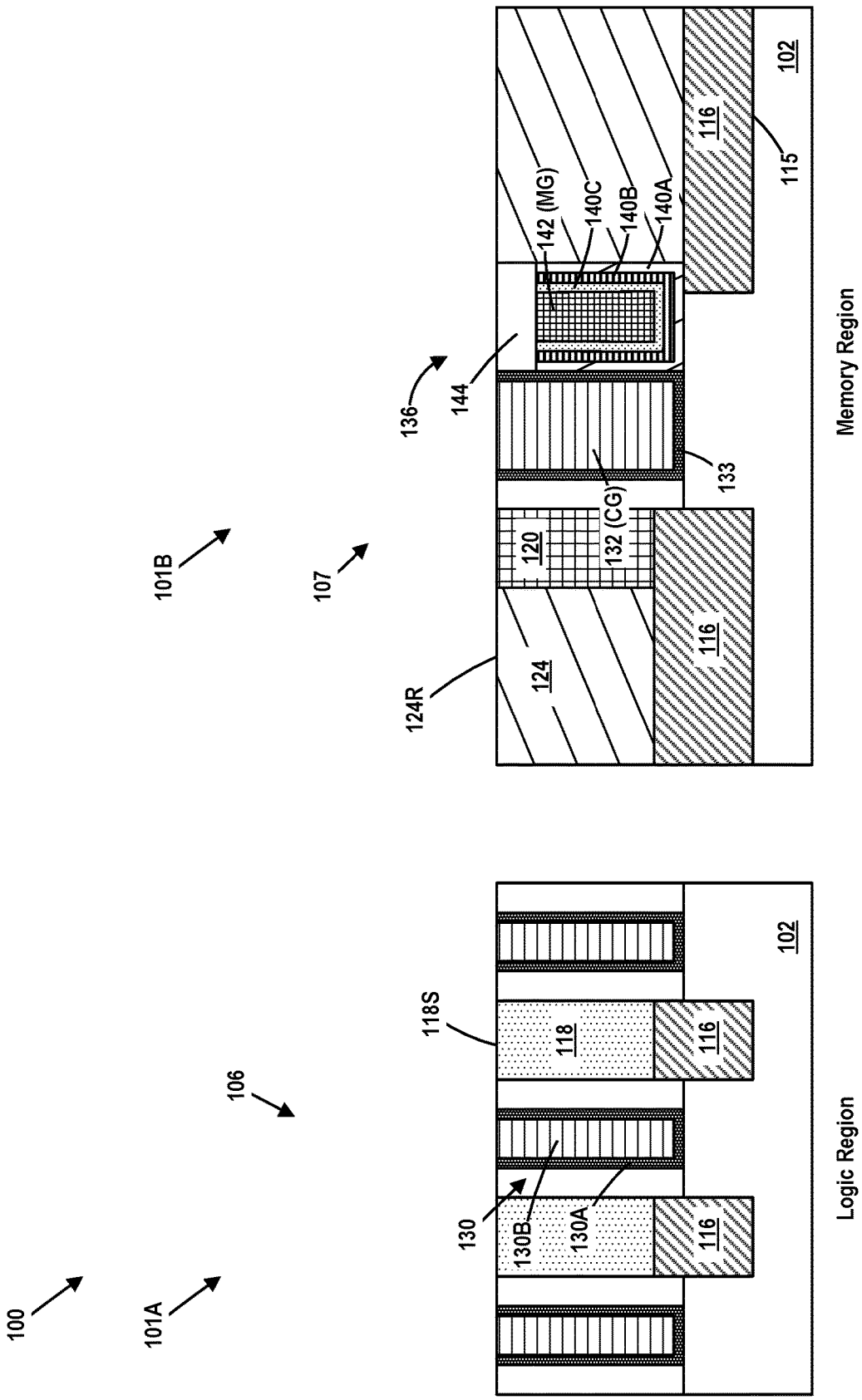

FIG. 26 depicts the IC product 100 after several process operations were performed to form the above-described final replacement gate structure 130 for the transistors 101A in the logic region and to form the selection gate electrode 132 (CG) and the gate insulation layer 133 of the SG-memory device 101B. Although not depicted in FIG. 26, the process begins with the removal of the sacrificial gate structures 108 so as to form the above-described gate cavities 125, as described above in connection with FIG. 14. At that point, the above-described final replacement gate structure 130 for the transistors 101A were formed in the gate cavities 125 in the logic region and the above-described selection gate electrode 132 (CG) and gate insulation layer 133 were formed in the gate cavity 125 of the SG-memory device 101B. As before, after these materials were formed in the replacement gate cavities 125, one or more CMP process operations were then performed to remove excess portions of these materials positioned outside the replacement gate cavities 125.

Figure 27:
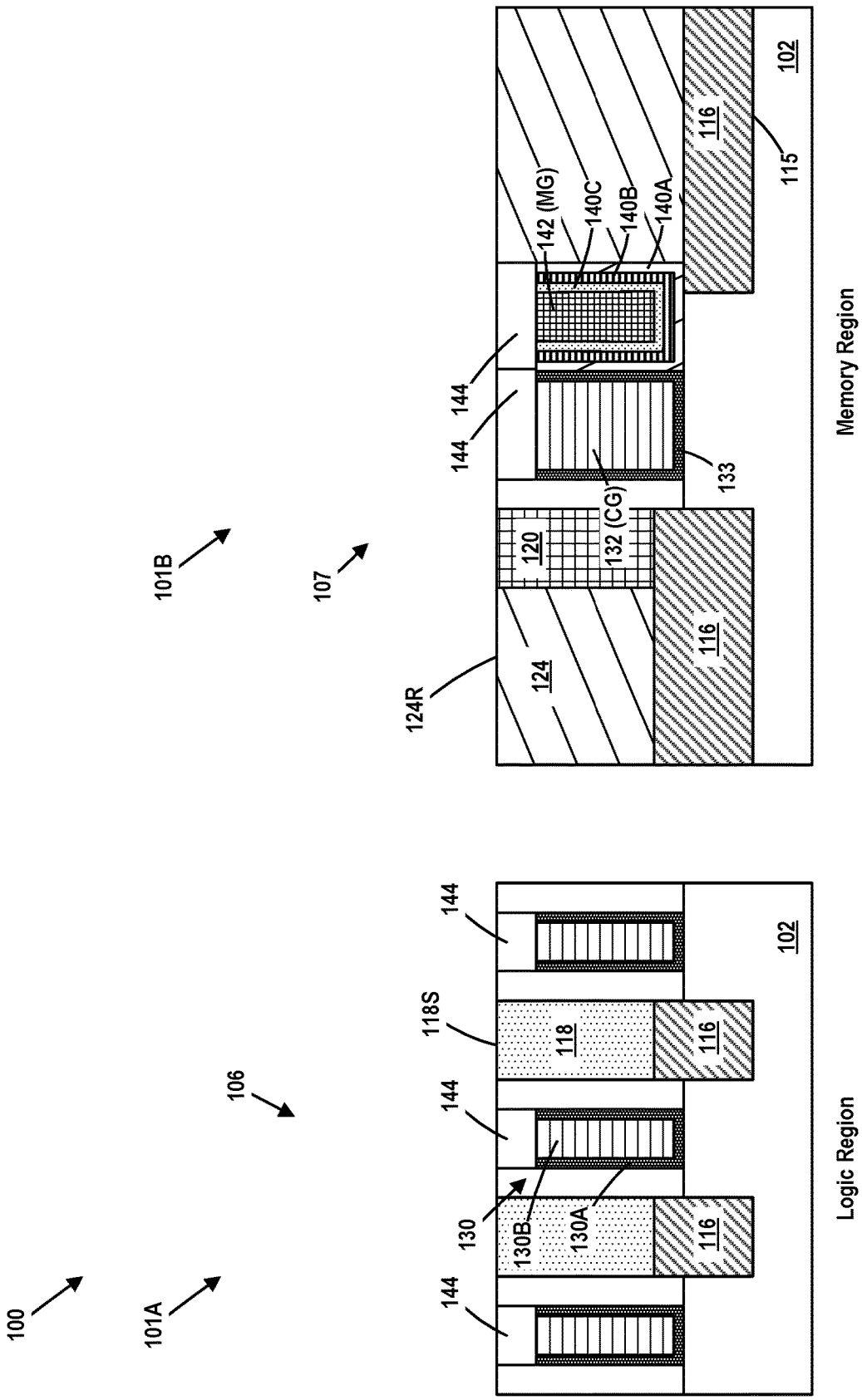

FIG. 27 depicts the IC product after the formation of the optional protective gate hardmasks 144 above the final gate structures 130 of the transistor devices 101A and the selection gate electrode 132 (SG) and gate insulation layer 133 using the methods previously described. At the point of processing depicted in FIG. 27, the above-described conductive source/drain structures 145 and the above-described conductive source/drain contact structures 148 may be formed using the methods disclosed above and discussed in connection with FIG. 18. As before, the gate insulation layer 133 also has a unique generally U-shaped configuration when viewed in a cross-sectional view taken through the selection gate electrode 132 (SG) in the gate length direction of the device.

As will be appreciated by those skilled in the art after a complete reading of the present application, the novel methods disclosed herein for formation of selection gate electrode 132 (CG) and the memory gate electrode 142 (MG) of the SG-memory device 101B are highly compatible with the process flows used to form gate structures 130 on transistors 101A in high-density logic areas on an IC product 100. For example, the methods and structures disclosed herein can be employed to form FinFET based transistors 101A in the logic region wherein the transistors have a very tight gate pitch while at the same time forming the gate insulation layer 133 and the selection gate electrode 132 (CG) for the SG-memory device 101B Moreover, the methods disclosed herein enable the formation of the plurality of layers of insulating material 140 and the memory gate electrode 142 of the SG-memory device 101B in a memory gate cavity 135 after removing portions of the sidewall spacers 112 and 120 to form the memory gate cavity 136. As noted above, the gate insulation layer 133 positioned on the selection gate electrode 132 (CG) and the layers of insulating material 140A, 140B and 140C positioned adjacent the memory gate electrode 142 (MG) all have a generally U-shaped configuration when viewed in a cross-section taken in a direction corresponding to the gate length direction of the devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:
1. An integrated circuit product, comprising:
a semiconductor substrate comprising an upper surface;
a conductive selection gate electrode and a first gate insulation layer positioned above the semiconductor substrate, the first gate insulation layer being positioned adjacent the conductive selection gate electrode,
a conductive memory gate electrode positioned above the semiconductor substrate and adjacent the conductive selection gate electrode, the conductive memory gate electrode comprising a bottom surface and first and second opposing sidewall surfaces; and
a plurality of layers of insulating material, a first portion of the plurality of layers of insulating material being positioned between the first gate insulation layer and the first opposing sidewall of the conductive memory gate electrode, a second portion of the plurality of layers of insulating material being positioned between the bottom surface of the conductive memory gate electrode and the upper surface of the semiconductor substrate and a third portion of the plurality of layers of insulating material being positioned and in contact with an entirety of the opposing sidewall and the bottom surface of the conductive memory gate electrode, wherein a first sidewall of the second portion is in continuous contact with a sidewall of the third portion and a second sidewall of the second portion is in continuous contact with a first sidewall of the first portion, wherein the plurality of layers are conformal with each other.

2. The integrated circuit product of claim 1, wherein the plurality of layers of insulating material comprises first, second and third layers of insulating material, wherein the first layer of insulating material is positioned on and in contact with the first gate insulation layer and on and in contact with the upper surface of the semiconductor substrate, the second layer of insulating material is positioned on and in contact with the first layer of insulating material, the third layer of insulating material is positioned on and in contact with the second layer of insulating material and wherein the third layer of insulating material is positioned on and in contact with the first opposing sidewall surface, the bottom surface and the second opposing sidewall surface of the conductive memory gate electrode.

3. The integrated circuit product of claim 1, wherein the plurality of layers of insulating material comprises a tunneling oxide layer, a charge storage layer and an insulating oxide layer, the charge storage layer comprising silicon nitride.

4. The integrated circuit product of claim 2, wherein the first layer of insulating material comprises silicon dioxide, the second layer of insulating material comprises silicon nitride, the third layer of insulating material comprises silicon dioxide and the conductive memory gate electrode comprises a metal or polysilicon.

5. The integrated circuit product of claim 1, wherein the conductive selection gate electrode has a gate length that extends in a gate length direction, and wherein, in a cross-sectional view taken through the plurality of layers of insulating material and the conductive memory gate electrode in a direction corresponding to the gate length direction, each of the plurality of layers of insulating material have a generally U-shaped configuration.

6. The integrated circuit product of claim 5, wherein, in a cross-sectional view taken through the first gate insulation layer in a direction corresponding to the gate length direction, the first gate insulation layer has a generally U-shaped configuration.

7. The integrated circuit product of claim 1, wherein the first and second opposing sidewalls are substantially vertically oriented relative to the upper surface of the semiconductor substrate.

8. The integrated circuit product of claim 1, wherein a portion of the first gate insulation layer is positioned between the conductive selection gate electrode and the first portion of the plurality of layers of insulating material for substantially an entire vertical height of the conductive selection gate electrode.

9. The integrated circuit product of claim 7, wherein the first portion of the plurality of layers of insulating material is positioned on and in contact with the first gate insulation layer.

10. The integrated circuit product of claim 1, further comprising a transistor formed in a logic region, the transistor comprising a gate insulation layer and a conductive gate electrode, wherein the gate insulation layer of the transistor and the first gate insulation layer comprise a same first material and wherein the conductive gate electrode of the transistor and the conductive selection gate electrode comprise a same second material.

11. The integrated circuit product of claim 1, wherein the conductive selection gate electrode and the first gate insulation layer define a first gate structure that comprises opposing lateral sidewalls, wherein the product further comprises a first inner sidewall spacer and a second outer sidewall spacer positioned on the first inner sidewall spacer, wherein, considered collectively, the first inner sidewall spacer and the second outer sidewall spacer are positioned adjacent only one of the opposing lateral sidewalls of the first gate structure.

12. The integrated circuit product of claim 11, wherein the first inner sidewall spacer has a first width at its base and the second outer sidewall spacer has a second width at its base, wherein the second width is greater than the first width.

13. The integrated circuit product of claim 12, wherein the first inner sidewall spacer and the second outer sidewall spacer are made of a same material.

14. The integrated circuit product of claim 11, further comprising first and second regions of epitaxial semiconductor material, the second region of epitaxial semiconductor material being positioned adjacent the conductive memory gate electrode, wherein at least a portion of the first region of epitaxial semiconductor material is partially positioned under the second sidewall spacer and wherein a vertical thickness of the first region of epitaxial semiconductor material is greater than a vertical thickness of the second region of epitaxial semiconductor material.

15. An integrated circuit product, comprising:
a semiconductor substrate comprising an upper surface;
a conductive selection gate electrode and a first gate insulation layer positioned above the semiconductor substrate, the first gate insulation layer being positioned on the conductive selection gate electrode,
a conductive memory gate electrode positioned above the semiconductor substrate and adjacent the conductive selection gate electrode, the conductive memory gate electrode comprising a bottom surface and first and second opposing sidewall surfaces;
a first layer of insulating material positioned on and in contact with the first gate insulation layer and on and in contact with the upper surface of the semiconductor substrate;
a second layer of insulating material positioned on and in contact with the first layer of insulating material; and
a third layer of insulating material, wherein an outer surface of the third layer of insulating material is positioned on and in contact with the second layer of insulating material and an inner surface of the third layer of insulating material is positioned on and in contact with the first opposing sidewall surface, the bottom surface and the second opposing sidewall surface of an entirety of a bottom surface of the conductive memory gate electrode, wherein the second layer is in continuous contact with an entirety of the third layer and the second layer is in continuous contact with an entirety of the first layer, wherein the first layer, the second layer and the third layer are conformal with each other.

16. The integrated circuit product of claim 15, wherein the third layer of insulating material is a tunneling oxide layer that comprises silicon dioxide, the second layer of insulating material is a charge storage layer that comprises silicon nitride and the third layer of insulating material is an insulating oxide layer that comprises silicon dioxide.

17. The integrated circuit product of claim 15, wherein a portion of the first gate insulation layer is positioned between the conductive selection gate electrode and the first layer of insulating material for substantially an entire vertical height of the conductive selection gate electrode.

18. The integrated circuit product of claim 15, further comprising a transistor formed in a logic region, the transistor comprising a gate insulation layer and a conductive gate electrode, wherein the gate insulation layer of the transistor and the first gate insulation layer comprise a same first material and wherein the conductive gate electrode of the transistor and the conductive selection gate electrode comprise a same second material.

19. The integrated circuit product of claim 15, wherein the conductive selection gate electrode and the first gate insulation layer define a first gate structure that comprises opposing lateral sidewalls, wherein the product further comprises a first inner sidewall spacer and a second outer sidewall spacer positioned on the first inner sidewall spacer, wherein, considered collectively, the first inner sidewall spacer and the second outer sidewall spacer are positioned adjacent only one of the opposing lateral sidewalls of the first gate structure.

20. The integrated circuit product of claim 19, wherein the first inner sidewall spacer has a first width at its base and the second outer sidewall spacer has a second width at its base, wherein the second width is greater than the first width.

* * * * *